(12) United States Patent
Tang

(10) Patent No.: US 11,081,193 B1
(45) Date of Patent: Aug. 3, 2021

(54) INVERTER BASED DELAY CHAIN FOR CALIBRATING DATA SIGNAL TO A CLOCK

(71) Applicant: SanDisk Technologies LLC, Addison, TX (US)

(72) Inventor: Tianyu Tang, Milpitas, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/903,274

(22) Filed: Jun. 16, 2020

(51) Int. Cl.
*G11C 16/32* (2006.01)
*G06F 13/16* (2006.01)
*H03K 19/21* (2006.01)
*G11C 16/04* (2006.01)

(52) U.S. Cl.
CPC .......... *G11C 16/32* (2013.01); *G06F 13/1668* (2013.01); *G11C 16/0483* (2013.01); *H03K 19/21* (2013.01)

(58) Field of Classification Search
CPC . G11C 16/32; G11C 16/0483; G06F 13/1668; H03K 19/21
See application file for complete search history.

(56) References Cited

U.S. PATENT DOCUMENTS

| 8,081,527 | B1 | 12/2011 | Venkataraman et al. |
| 9,673,798 | B1 | 6/2017 | Tang et al. |
| 9,881,662 | B2 | 1/2018 | Glovannini et al. |
| 9,997,220 | B2 | 6/2018 | Miyano et al. |
| 10,069,496 | B1* | 9/2018 | Behl ................. H03K 19/00369 |
| 10,447,247 | B1 | 10/2019 | Tang et al. |
| 10,528,255 | B2 | 1/2020 | Lee et al. |
| 10,587,247 | B2 | 3/2020 | Tang et al. |
| 10,628,254 | B2 | 4/2020 | Lee |
| 2001/0013802 | A1* | 8/2001 | Faulcon .................. H03L 7/091 327/244 |
| 2006/0052961 | A1* | 3/2006 | Best ..................... G06F 13/1689 702/106 |

(Continued)

OTHER PUBLICATIONS

J. Lee, H. Kim, C. Jeong, J. Lee and C. Yoo, "Skew Compensation Technique for Source-Synchronous Parallel DRAM Interface," in IEEE Transactions on Very Large Scale Integration (VLSI) Systems, vol. 21, No. 11, pp. 2155-2159, Nov. 2013, doi: 10.1109/TVLSI.2012.2227853. (Year: 2013).*

(Continued)

*Primary Examiner* — Ajay Ojha
(74) *Attorney, Agent, or Firm* — Vierra Magen Marcus LLP

(57) ABSTRACT

Technology is disclosed herein for correcting skew between data signals and a clock signal. In one aspect, a memory system has a delay circuit having delay blocks, with each delay block having one or more inverters. The delay circuit is configured to pass a data signal through either an odd number of the inverters or an even number of the inverters to produce a delayed data signal. The memory system has a skew correction circuit configured to control the number of inverters in the delay circuit through which the data signal is passed in order to correct skew between the data signal and the clock signal. The memory system has a polarity correction circuit configured to invert the data signal in the event that the delay circuit passed the data signal through the odd number of the inverters.

20 Claims, 12 Drawing Sheets

(56) References Cited

U.S. PATENT DOCUMENTS

| | | | |
|---|---|---|---|
| 2010/0315142 A1* | 12/2010 | Zerbe | H04L 7/10 |
| | | | 327/161 |
| 2015/0185758 A1* | 7/2015 | Jung | G06F 1/12 |
| | | | 713/401 |
| 2018/0175834 A1 | 6/2018 | Modi et al. | |
| 2019/0296723 A1 | 9/2019 | Tang et al. | |
| 2020/0133540 A1 | 4/2020 | Pilolli et al. | |

OTHER PUBLICATIONS

Jung-Bae Lee et al., "Digitally-controlled DLL and I/O circuits for 500 Mb/s/pin /spl times/16 DDR SDRAM," 2001 IEEE International Solid-State Circuits Conference. Digest of Technical Papers. ISSCC (Cat. No. 01CH37177), San Francisco, CA, USA, 2001, pp. 68-69, doi: 10.1109/ISSCC.2001.912550. (Year: 2001).*

ONFI, "Open NAND Flash Interface Specification," Rev. 4.1, [www.onfi.org], Dec. 12, 2017, 338 pages.

\* cited by examiner

INVERTER BASED DELAY CHAIN FOR CALIBRATING DATA SIGNAL TO A CLOCK

BACKGROUND

In source synchronous systems, a sending circuit may send both data signals carrying data and a clock signal to a receiving circuit. The receiving circuit may use the clock signal to identify data values of the data carried by the data signals. In particular, the receiving circuit may identify levels of data pulses identifying the data values in response to detecting transitions of the clock signal. Ideally, the clock transitions occur at optimal times that optimize the receiving circuit's ability to identify the correct levels of the data pulses. A deviation of the clock transitions from their optimal times may be referred to as skew between the clock signal and the data signal. Too large of skew between the data signals and clock signal may cause the receiving circuit to incorrectly identify the levels of the data pulses. Increases in frequency of the data and clock signals serve to magnify the skew problem.

BRIEF DESCRIPTION OF THE DRAWINGS

Like-numbered elements refer to common components in the different Figures.

DETAILED DESCRIPTION

Technology is disclosed herein for correcting skew between data signals and a clock signal. Some embodiments include a memory system that corrects skew between data signals and clock signal. One embodiment of the memory system has a delay circuit having delay blocks, with each delay block having one or more inverters. The delay circuit is configured to pass a data signal from a data input contact through either an odd number of the inverters or an even number of the inverters to produce a delayed data signal. The memory system has a sampling circuit configured to sample the delayed data signal from the delay circuit based on a clock signal from a clock input contact. The memory system has a skew correction circuit configured to control the number of inverters in the delay circuit through which the data signal is passed in order to correct skew between the data signal and the clock signal. The memory system has a polarity correction circuit configured to invert the data signal from the sampling circuit in the event that the delay circuit passed the data signal through the odd number of the inverters.

In some embodiments, the delay circuit has a delay chain having a single inverter. The single inverter provides one unit of delay. The delay circuit has other delay chains having some even number of inverters (e.g., two, four, eight, etc.). Each delay chain can either be selected or bypassed. In other words, the data signal can either be passed through a delay chain to provide a measure of delay provided by the delay chain, or not passed through a delay chain to avoid the delay of that particular delay chain. Having a delay chain with a single inverter provides for fine resolution in the amount of delay that the delay circuit can provide. Therefore, the skew can be accurately corrected. In the event that data signal is passed through the delay chain with the single inverter, the correction circuit inverts the data signal such that the data signal has the proper polarity. In some embodiments, the sampling circuit latches the data signal in response to a transition of the clock signal. The correction circuit correct the polarity of the data signal, if necessary, after the data signal is latched.

Figure 1:
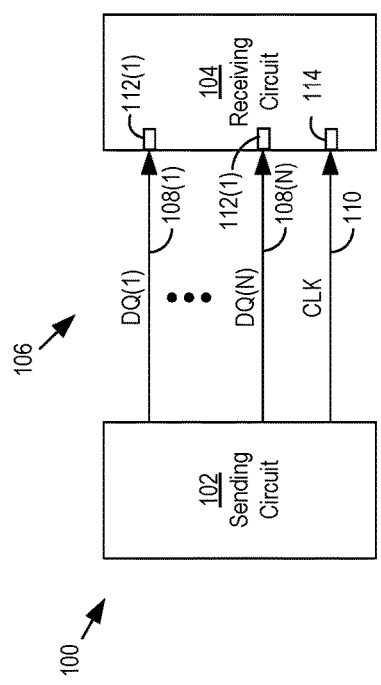
FIG. 1 is a block diagram of an example system that includes a sending circuit and a receiving circuit.

FIG. 1 shows one embodiment of a system 100 in which one or more data/clock alignment circuits may be implemented. The system 100 includes a sending circuit 102 and a receiving circuit 104 configured to communicate with each other via a communications bus 106. Both the sending circuit 102 and the receiver circuit 104 may be transceiver circuits, which can be configured to transmit and receive signals. For simplicity, with reference to FIG. 1, one of the circuits 102 is designated as the sending circuit 102 and the other circuit 104 is designated as the receiving circuit 104.

Additionally, in particular example configurations, each of the sending circuit 102 and the receiving circuit 104 are integrated circuits (IC). In general, an integrated circuit (IC)—also referred to as a monolithic IC, a chip, or a microchip—is an assembly or a collection of electric circuit components (including active components, such as transistors and diodes, and passive components, such as capacitors and resistors) and their interconnections formed as a single unit, such as by being fabricated, on a substrate typically made of a semiconductor material such as silicon. For such embodiments, the sending circuit 102 and the receiving circuit 104 are separate integrated circuits, and the communication bus 106 is configured to communicate signals external to the separate sending circuit (IC) 102 and the receiving circuit (IC) 104.

The sending circuit 102 is configured to send a clock signal CLK and a plurality of data signals DQ to the receiving circuit 104 via a communications bus 106. Otherwise stated, the receiving circuit 104 is configured to receive a clock signal CLK and a plurality data signals DQ from the sending circuit 102 via the communications bus 106. The plurality of data signals DQ are shown in FIG. 1 as including data signals DQ(1) to DQ(N), where N is two or more. For particular example configurations, N is 8, although other integer numbers of two or more may be possible for other example configurations.

From the perspective of the sending circuit 102, the clock signal CLK is an output clock signal, and the data signals DQ are output data signals in that they are the clock and data signals that the sending circuit 102 outputs to the receiving circuit 104. From the perspective of the receiving circuit 104, the clock signal CLK is an input clock signal, and the data signals DQ are input data signals in that they are the clock and data signals that the receiving circuit 104 receives from the sending circuit 102. For clarity, the clock signal CLK and the data signals DQ are hereafter referred to as input clock and data signals in that much of the description below pertains to skew correction, clock/data alignment, and write training performed from the perspective of the receiving circuit 104.

The communications bus 106 includes data lines 108(1) to 108(N) between the sending circuit 102 and the clock circuit 104. The receiving circuit has data input contacts 112(1) to 112(N), which are in physical and electrical contact with the respective data lines 108(1) to 108(N). The data input contacts 112(1) to 112(N) could be pins, pads, etc. The sending circuit 102 is configured to send the data signals DQ(1) to DQ(N) simultaneously and/or in parallel over the data lines 108(1) to 108(N) to the receiving circuit 104. Otherwise stated, the receiving circuit 104 is configured to receive the data signals DQ(1) to DQ(N) simultaneously and/or in parallel from over the data lines 108(1) to 108(N).

In addition, the communications bus 106 includes one or more clock lines 110 between the sending circuit 102 and the receiving circuit 104. The receiving circuit has one or more clock input contacts 114, which is/are in physical and electrical contact with the respective one or more clock lines 110. The clock input contact(s) could be pins, pads, etc. As described in further detail below, the input clock signal CLK may include a single-ended clock signal or a pair of complementary clock signals (e.g., CLK and CLKB). Where the input clock signal CLK is a single-ended clock signal, the one or more clock lines 110 may include a single clock line. Where the input clock signal CLK is a pair of complementary clock signals CLK, CLKB, the one or more clock lines 110 may include two clock lines. The sending circuit 102 may be configured to transmit each clock signal CLK, CLKB of the complementary pair over a respective one of the two clock lines 110. The receiving circuit 104 is configured to receive the input clock signal CLK—either as a single-ended clock signal or as a pair of complementary clock signals—simultaneously and/or in parallel with the input of data signals DQ(1) to DQ(N).

The sending circuit 102 and the receiving circuit 104 form a source synchronous system 100. A source synchronous system is a system in which a source circuit sends a data signal along with a clock signal to a destination circuit in order for the destination circuit to use the clock signal to identify the data values of the data signal. In the system 100, the sending circuit 102 is the source circuit, and the receiving circuit 104 is the destination circuit. However, as transceiver circuits, the sending circuit 102 and the receiving circuit 104 may change roles. For example, in certain operations, circuit 104 sends a clock signal and a data signal to circuit 102, and circuit 102 uses the clock signal to identify the data values of the data signal. For such operations, the circuit 104 becomes the sending or the source circuit, and the circuit 102 becomes the receiving or the destination circuit.

In general, a signal, such as the input clock signal CLK and the input data signals DQ may be at a level at a given point in time. As used herein, a level of a signal is a magnitude value, such as a voltage magnitude value or a current magnitude value. In some cases, the signal may be referred to as being at a high level or at a low level, transitioning between a high level and a low level, or transitioning between a low level and a high level. A high level of a signal may be a single high level, a level that is within a set or range of high levels, a maximum high level or a minimum high level of a set or range of high levels, or an average high level of a set or range of high levels. Similarly, a low level of a signal may be a single low level, a level that is within a set or range of low levels, a maximum low level or a minimum low level of a set or range of low levels, or an average low level of a set or range of low levels.

Figure 2A:
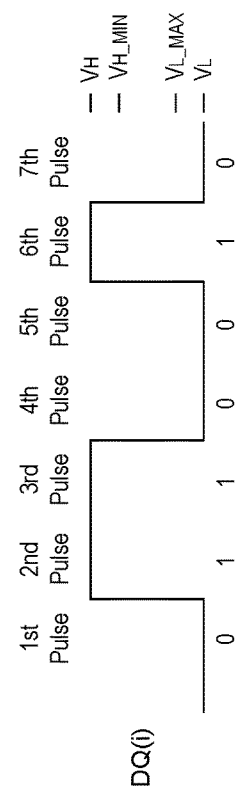
FIG. 2A is an example timing diagram of a data signal.
Figure 2B:
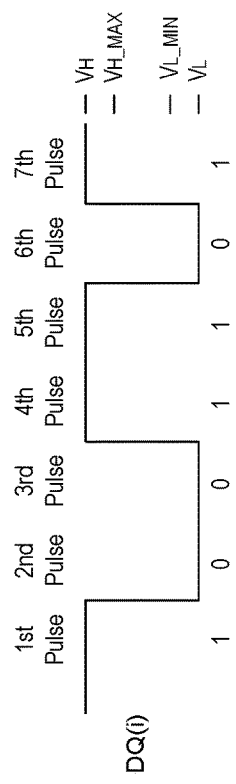
FIG. 2B is an example timing diagram of an inverted version of the data signal of FIG. 2A.

With reference to FIGS. 2A and 2B, a high level of a signal is a level that is at or above a minimum high level $V_{H\_MIN}$, and a low level of the signal is a level that is at or below a maximum low level $V_{L\_MAX}$. The minimum high level $V_{H\_MIN}$ and the maximum low level $V_{L\_MIN}$ may be predetermined levels or values, and in particular example configurations, predetermined levels or values specified as part of a swing requirement with which the source circuit 102 is configured to comply when transmitting the signal. A signal that transitions according to and/or in compliance with the swing requirement transitions to a high level that is at or above the minimum high level $V_{H\_MIN}$ of the swing requirement, and transitions to a low level that is at or below the maximum low level $V_{L\_MAX}$ of the swing requirement.

In general, a signal performs transitions between its high level and its low level. A given transition of a signal may be one of two transition types, including a rising transition and a falling transition. A signal performs a rising transition when the signal transitions from its low level to its high level, and performs a falling transition when the signal transitions from its high level to its low level.

A portion of a magnitude waveform of a signal over a transition is referred to as an edge. In particular, a portion of the magnitude waveform over a rising transition is a rising edge and a portion of the magnitude waveform over a falling transition is a falling edge.

Also, a clock signal, such as the input clock signal CLK, is a signal that has repetitive cycles occurring over successive periods T. Within a cycle, one of the portions is at a high level and the other portion is at a low level. Accordingly, the portions may be defined by consecutive rising and falling transitions or edges of the clock signal. For example, a given rising edge or a given falling edge may define or mark a boundary when one portion ends and a next portion, either of the same cycle or of a next cycle, begins.

In addition, a clock signal may include clock pulses that are formed or defined by the rising and falling edges of the clock signal. In particular example configurations, the clock pulses of a clock signal correspond to the high level of the clock signal, in that each clock pulse is defined by a rising edge followed by a period where the clock signal is at its high level, and then followed by a falling edge. A pulse width of a given clock pulse is a time duration extending from a time that the magnitude of the rising edge of the clock pulse is at or rises to a predetermined level (e.g., 50% of the high level) to a time that the magnitude of the falling edge of the clock pulse is at or falls to the predetermined level.

The clock pulses of the clock signal may occur according to the frequency of the clock signal.

Additionally, a data signal is a signal that carries and/or includes data. The data carried by and/or included in a data signal includes a bit sequence of bits, where each bit includes or has a single-bit logic value of "1" or "0". The data signal may include a series or sequence of data pulses corresponding to a bit sequence of the data. Each data pulse may be at a level that indicates a data value, otherwise referred to as a logic level or a logic value. In addition, each data value is represented by a binary number or a binary value that includes one or more digits corresponding to and/or representing the one or more bits of the bit sequence. A duration of a data pulse is an amount of time that the level of the data pulse indicates the data value that the data pulse represents.

FIG. 2A shows a timing diagram of magnitude waveform of a portion of an example ith data signal DQ(i) representative of one of the input data signals DQ(1) to DQ(N). For purposes of illustration, the ith data signal DQ(i) shown in FIG. 2A includes seven data pulses. Each data pulse is shown as being either at a high level at or above a minimum high level $V_{H\_MIN}$ or at a low level at or below a maximum low level $V_{L\_MAX}$. For the example data signal DQ(i) in FIG. 2A, the high level and the low level each indicate a single-bit logic value of "1" or "0", where the high level corresponds to and/or indicates a single-bit logic value of "1" (otherwise referred to as a logic 1 value) and the low level corresponds to and/or indicates a single-bit logic value of "0" (otherwise referred to as a logic 0 value). Other example data signals where different levels of the magnitude waveform correspond to and/or indicate multi-bit logic values (i.e., logic values that each include two or more digits or bits) may be possible.

For two consecutive data pulses of the ith data signal DQ(i), where the two consecutive pulses correspond to different logic levels, the data signal DQ(i) performs a rising transition or a falling transition to transition between the two consecutive data pulses. For the example shown in FIG. 2A, where one pulse in the sequence indicates a logic 0 value and a next pulse in the sequence indicates a logic 1 value, the ith data signal DQ(i) performs a rising transition to transition between the first and second pulses. On the other hand, where one pulse corresponds to a logic 1 value and a next pulse indicates a logic 0 value, the ith data signal DQ(i) performs a falling transition to transition between the first and second pulses. In addition, where two consecutive pulses indicate the same logic level, then as the pulse sequence transitions from the first data pulse to the next data pulse, the level of the ith data signal DQ(i) stays the same during those two pulses, and a rising transition or a falling transition may not occur. Regardless of whether a change in level of the ith data signal DQ(i) occurs when transitioning between two consecutive data pulses, the start of a given data pulse is referred to as a starting transition of the data pulse, and the end of a given data pulse is referred to as an ending transition of the data pulse.

In some embodiments, the receiving circuit 104 might possibly invert the data signal as the data signal is being processed. In one embodiment, the receiving circuit 104 inverts the data signal by passing the data signal through an odd number of inverters. Note that passing the data signal through inverters may be used to delay the data signal to correct skew between the data signal and the clock signal. FIG. 2B depicts an inverted version of the data signal of FIG. 2A. Inverting the data signal causes the low voltage pulses of the data signal to be high voltage pulses, and causes the high voltage pulses of the data signal to be low voltage pulses. Also, inverting the data signal causes a "0" to be a "1", and likewise causes a "1" to be a "0".

Referring again to FIG. 1, the receiving circuit 104 may include sampling circuitry that performs sampling actions to identify data values of data carried by the input data signals DQ. As used herein, a sampling action is an action performed to determine, identify, detect, capture, obtain, or latch onto, a level or magnitude of a signal at a given point in time. A circuit that performs sampling actions is referred to as a sampling circuit, and the signal on which the sampling circuit performs a sampling action is referred to as an input signal of the sampling circuit. A sampling circuit performing a sampling action on an input signal may include an input terminal configured to receive the input signal. In addition, a sampling circuit performing a sampling action may output or present the level of the input signal that it identifies. The sampling circuit may do so by generating an output signal at an output terminal of the sampling circuit at a level that indicates or corresponds to the level of the input signal that the sampling circuit identifies at its input terminal. Accordingly, a sampling circuit samples an input signal, samples a level of the input signal, or performs a sampling action on an input signal by identifying a level of an input signal and outputting an output signal at a level indicating the level of the input signal that it identifies.

In particular example configurations, the sampling circuit generates its output signal at a level that matches, directly corresponds to, or is equal in value to the level of the input signal that it identifies. For example, if the sampling circuit identifies its input signal at a low level, then the sampling circuit performs a sampling action by generating its output signal at its output terminal at a low level, and if the sampling circuit identifies its input signal at a high level, then the sampling circuit performs a sampling action by generating its output signal at its output terminal at a high level.

In addition, a sampling circuit performs sampling actions in response to detecting a transitions in a clock. The clock transition may be a rising transition or a falling transition, although in some embodiments, sampling transitions may include both rising transitions and falling transitions. Each time a sampling circuit detects a clock transition, the sampling circuit samples the input signal. The input signal that a sampling circuit samples is referred to as its input data signal, and the output signal that a sampling circuit generates and outputs in response to performing sampling actions on the input signal is referred to as its output data signal.

The sampling circuitry of the receiver circuit 104 may include a separate sampling circuit for each input data signal D1(1) to DQ(N). Each of the sampling circuits is configured to sample the levels of a respective one of the data signals DQ(1) to DQ(N). An example sampling circuit is a flip flop, such a D flip flop for example.

Figure 3:
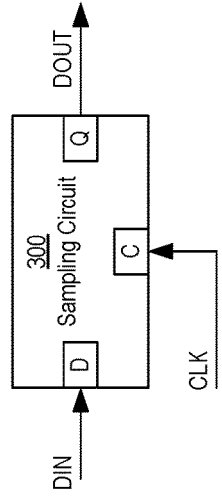
FIG. 3 is a block diagram of an example sampling circuit.

FIG. 3 is a block diagram of an example sampling circuit 300, such as a flip flop or a latch. The sampling circuit 300 includes a data input terminal or node D, a data output terminal or node Q, and a clock input terminal or node C. The data input terminal D is configured to receive an input data signal DIN of which the sampling circuit 300 is configured to sample. The clock input terminal C is configured to receive a clock signal CLK of which the sampling circuit 300 is configured to detect sampling transitions. The data output terminal Q is configured to output an output data signal DOUT at levels and at times based on the levels of the input data signal DIN and the sampling transitions of the clock signal CLK. In particular, the sampling circuit 300 is configured to detect when each of the sampling transitions of the clock signal CLK occur. When the sampling circuit 300 detects that a sampling transition occurs, the sampling circuit 300 samples the level of the input data signal DIN at the data input terminal D, and generates the output data signal DOUT at the level of the input data signal DIN that the sampling circuit 300 identified. The sampling circuit 300 maintains or holds the output data signal DOUT at the data output terminal Q at the level it identified until it detects the next sampling transition of the clock signal CLK. Upon detecting the next sampling transition of the clock signal CLK, the sampling circuit 300 will again identify the level of the input data signal DIN at the data input terminal D, and generate the output data signal DOUT at the level of the input data signal DIN that the sampling circuit 300 identified in response to the next sampling transition. The sampling circuit 300 may continue to operate in this manner as it continues to receive additional data pulses of the input data signal DIN and detect sampling transitions of the clock signal CLK.

Figure 4:
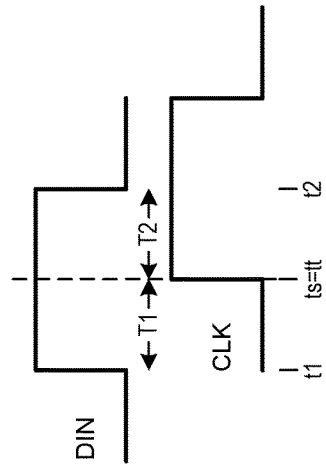
FIG. 4 is a schematic diagram of setup and hold time requirements of the sampling circuit of FIG. 3.

FIG. 4 is a schematic diagram illustrating setup time and hold time requirements of the sampling circuit 300. A sampling transition of the clock signal CLK is shown as occurring at a clock event time tce. An occurrence of a sampling transition of the clock signal CLK may be referred to as a clock event. When the sampling circuit 300 detects a sampling transition, it detects a clock event. A time duration from a first time t1 to the clock event time tce denotes the setup time tDS, and a time duration from the clock event time tce to a second time denotes the hold time tDH. In order to meet the setup and hold requirements of the sampling circuit 300, the level of a data pulse of the input data signal DIN should be stable from the first time t1 to the second time t2. A setup violation occurs when the level of input data signal DIN is unstable (it is still changing) after the first time t1 occurs. In other words, a setup violation occurs when the actual amount of time that the level of the input data signal DIN is stable before occurrence of the sampling transition at the clock event time tce is less than the amount of the setup time tDS. In addition, a hold violation occurs when the level of the input data signal DIN is unstable (it changes) before the second time t2. In other words, a hold violation occurs when the actual amount of time that the level of the input data signal DIN is stable after occurrence of the sampling transition at the clock event time tce is less than the amount of the hold time tDH.

For a data pulse of the input data signal DIN that the sampling circuit 300 is to sample, at least a portion of the duration that a level of the data pulse is stable—e.g., at least a portion of the duration that the data pulse is at the high level or at the low level—defines a data valid window $T_{DVW}$. A data valid window $T_{DVW}$ is a time period or duration over which a given data pulse occurs during which a sampling circuit is to detect a sampling transition of the clock signal in order to avoid a setup violation and a hold violation. If the sampling transition occurs before the start of the data valid window $T_{DVW}$, then a setup violation occurs—either because the sampling transition occurred before the starting transition of the data pulse, or because the sampling transition occurred too close to after the starting transition that the actual amount of time that the level of the data pulse is stable before occurrence of the sampling transition is less than the setup time tDS. In addition, if the sampling transition occurs after the end of the data valid window $T_{DVW}$, then a hold violation occurs—either because the sampling transition occurred after the ending transition of the data pulse or occurred too close to before the ending transition that the actual amount of time that the level of the data pulse is stable after occurrence of the sampling transition is less than the hold time tDH.

Ideally, the sampling circuit 300 receives the clock signal CLK and the input data signal DIN relative to each other such that the sampling circuit 300 reliably or accurately samples the level of each data pulse in order to correctly identify the data value that each data pulse represents. Configuring the sampling circuit 300 to sample each data pulse in the middle or at a middle point of the duration of each pulse may maximize the chances of this ideal situation occurring. The ideal time at which to sample a data pulse is referred to as a target sampling time of the data pulse. Ideally, the sampling circuit 300 identifies sampling transitions in the middle of the durations of the data pulses and/or at the target sampling times of the data pulses. Accordingly, a given sampling transition is in a target sampling position when the sampling transition occurs at the target sampling time of its associated data pulse.

Figure 5:
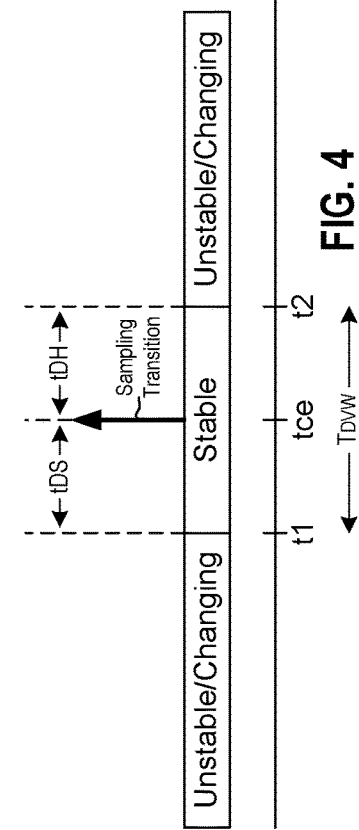
FIG. 5 is a timing diagram of a sampling transition of a clock signal in a target sampling position.

FIG. 5 shows a data pulse of the input data signal DIN and a pulse of the clock signal CLK, illustrating the ideal case where a sampling transition of the clock pulse is in the target sampling position. In FIG. 5, a starting transition of the data pulse occurs at a first time t1, and an ending transition of the data pulse occurs at a second time t2. A target sampling time tt of the data pulse occurs in the middle between the first time t1 and the second time t2. Accordingly, a first time period T1 extending from the first time t1 to the target sampling time tt is the same as or equal to a second time period T2 extending from the target sampling time tt to the second time t2. Additionally, the sampling transition associated with the data pulse is the rising transition of the clock pulse. The sampling transition occurs at a sampling time ts. In FIG. 5, for the ideal case, the sampling transition occurs at the target sampling time—i.e., the sampling time ts and the target sampling time tt are the same.

In actuality, when the sending circuit 102 sends the data signals DQ and the clock signal CLK to the receiving circuit 104, the sampling circuitry of the receiving circuit 104 may not receive the clock pulses in their respective target sampling positions. For a given sampling circuit that samples data pulses of an input data signal in response to sampling transitions of a clock signal, where the sampling transitions occur at times different than the target sampling times tt, the input data signal and the clock signal have skew between them. In general, as used herein, skew between a clock signal and a data signal is a deviation of a sampling transition of the clock signal from a target sampling position to sample a data pulse of the data signal. In addition, with respect to sampling times, skew between a clock signal and a data signal is a deviation of a sampling time ts from a target sampling time tt to sample a data pulse of a data signal. For a given pair of clock and data signals, where the clock signal performs sampling transitions at sampling times ts that match or occur at the same times as the target sampling times tt, the clock and data signals do not have skew between them. Alternatively, where the clock signal performs sampling transitions at sampling times ts different than the target sampling times tt (i.e., before or after the target sampling times tt), the clock and data signals have skew between them. An amount of skew (or skew amount) may be quantified by the difference in time between the sampling time ts and the target sampling time tt.

Various manufacturing or environmental conditions may cause skew between clock and data signals, such as imperfections in the alignment and transmission of the clock and data signals by the sending circuit 102, differences in propagation delay in the lines of the communications bus 106, or process-voltage-temperature (PVT) fluctuations, as non-limiting examples. Not only do such manufacturing or environmental conditions displace sampling transitions of the clock signal CLK from their target sampling positions, but they may displace the sampling transitions by different amounts for sampling different data signals DQ. That is, for sampling circuits that sample the input data signals DQ in response to sampling transitions of the clock signal CLK, some sampling circuits may receive sampling transitions of the clock signal CLK further away from the target sampling transitions than others. As operating frequencies continue to increase, differences in skew between the clock signal CLK and different data signals DQ may be more pronounced, requiring skew correction processes that can flexibly or independently correct for skew for multiple data signals DQ.

Figure 6A:
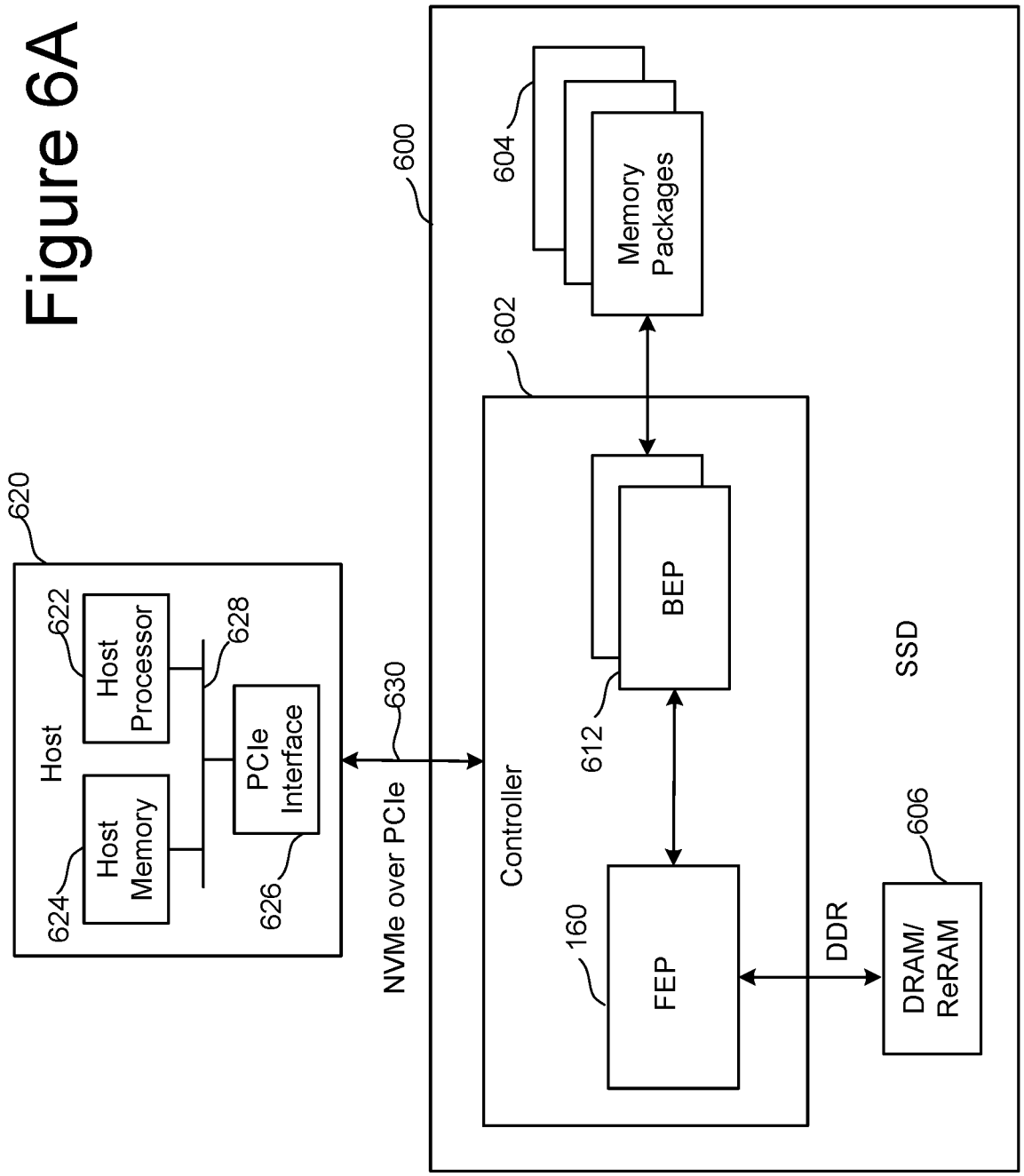
FIG. 6A is a block diagram of one embodiment of a storage device connected to a host.

Embodiments of skew correction systems are disclosed herein. In some embodiments, the skew correction system is implemented in a memory system. FIGS. 6A, 6B, 7, 8, and 9 depict an example memory system in which embodiments of skew correction system may be practiced. FIG. 6A is a block diagram of one embodiment of a storage device 600 connected to a host 620. Storage device 600 can implement the technology proposed herein. Many different types of storage devices can be used with the technology proposed herein. One example storage device is a solid state device (SSD); however, other types of storage devices can also be used. Storage device 600 comprises a Controller 602, non-volatile memory 604 for storing data, and local memory (e.g. DRAM/ReRAM) 606. Controller 602 comprises a Front End Processor Circuit (FEP) 610 and one or more Back End Processor Circuits (BEP) 612. In one embodiment, FEP 610 circuit is implemented on an ASIC. In one embodiment, each BEP circuit 612 is implemented on a separate ASIC. The ASICs for each of the BEP circuits 612 and the FEP circuit 610 are implemented on the same semiconductor such that the Controller 602 is manufactured as a System on a Chip (SoC). FEP 610 and BEP 612 both include their own processors. In one embodiment, FEP 610 and BEP 612 work as a master slave configuration where the FEP 610 is the master and each BEP 612 is a slave. For example, FEP circuit 610 implements a flash translation layer that performs memory management (e.g., garbage collection, wear leveling, etc.), logical to physical address translation, communication with the host, management of DRAM (local volatile memory) and management of the overall operation of the SSD (or other non-volatile storage device). The BEP circuit 612 manages memory operations in the memory packages/die at the request of FEP circuit 110. For example, the BEP circuit 612 can carry out the read, erase and programming processes. Additionally, the BEP circuit 612 can perform buffer management, set specific voltage levels required by the FEP circuit 610, perform error correction, control the Toggle Mode interfaces to the memory packages, etc. In one embodiment, each BEP circuit 612 is responsible for its own set of memory packages. Controller 602 is one example of a control circuit.

In one embodiment, non-volatile memory 604 comprises a plurality of memory packages. Each memory package includes one or more memory die. Therefore, Controller 602 is connected to one or more non-volatile memory die. In one embodiment, each memory die in the memory packages 604 utilize NAND flash memory (including two dimensional NAND flash memory and/or three dimensional NAND flash memory). In other embodiments, the memory package can include other types of memory.

Controller 602 communicates with host 620 via an interface 630 that implements NVM Express (NVMe) over PCI Express (PCIe). For working with storage device 600, host 620 includes a host processor 622, host memory 624, and a PCIe interface 626 connected to bus 628. Host memory 624 is the host's physical memory, and can be DRAM, SRAM, non-volatile memory or another type of storage. Host 620 is external to and separate from storage device 600. In one embodiment, storage device 600 is embedded in host 620. Any combination of one or more of storage device 600, controller 602, FEP 610, BEP 612, and/or memory packages 604 may be referred to herein as an apparatus. In operation, when the host 620 needs to read data from or write data to the non-volatile memory 604, it will communicate with the controller 602. If the host 620 provides a logical address to which data is to be read/written, the controller can convert the logical address received from the host to a physical address in the non-volatile memory 604.

Figure 6B:
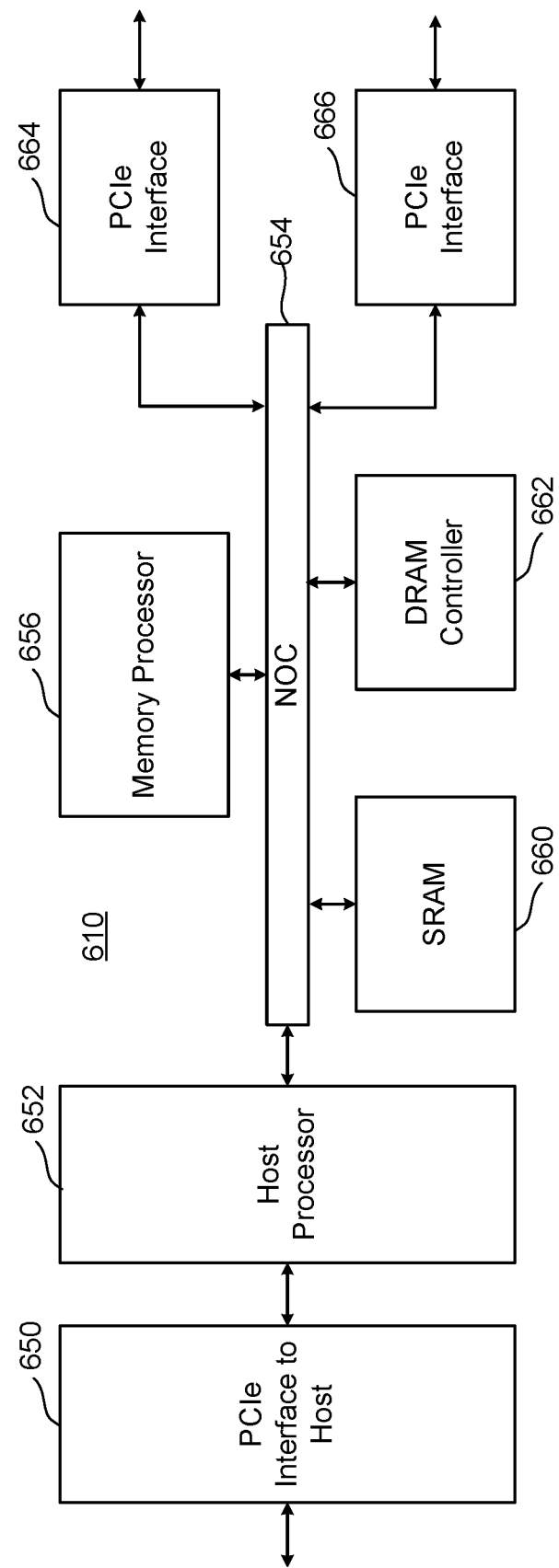
FIG. 6B is a block diagram of one embodiment of a Front End Processor Circuit. In some embodiments, the Front End Processor Circuit is part of a Controller.
Figure 7:
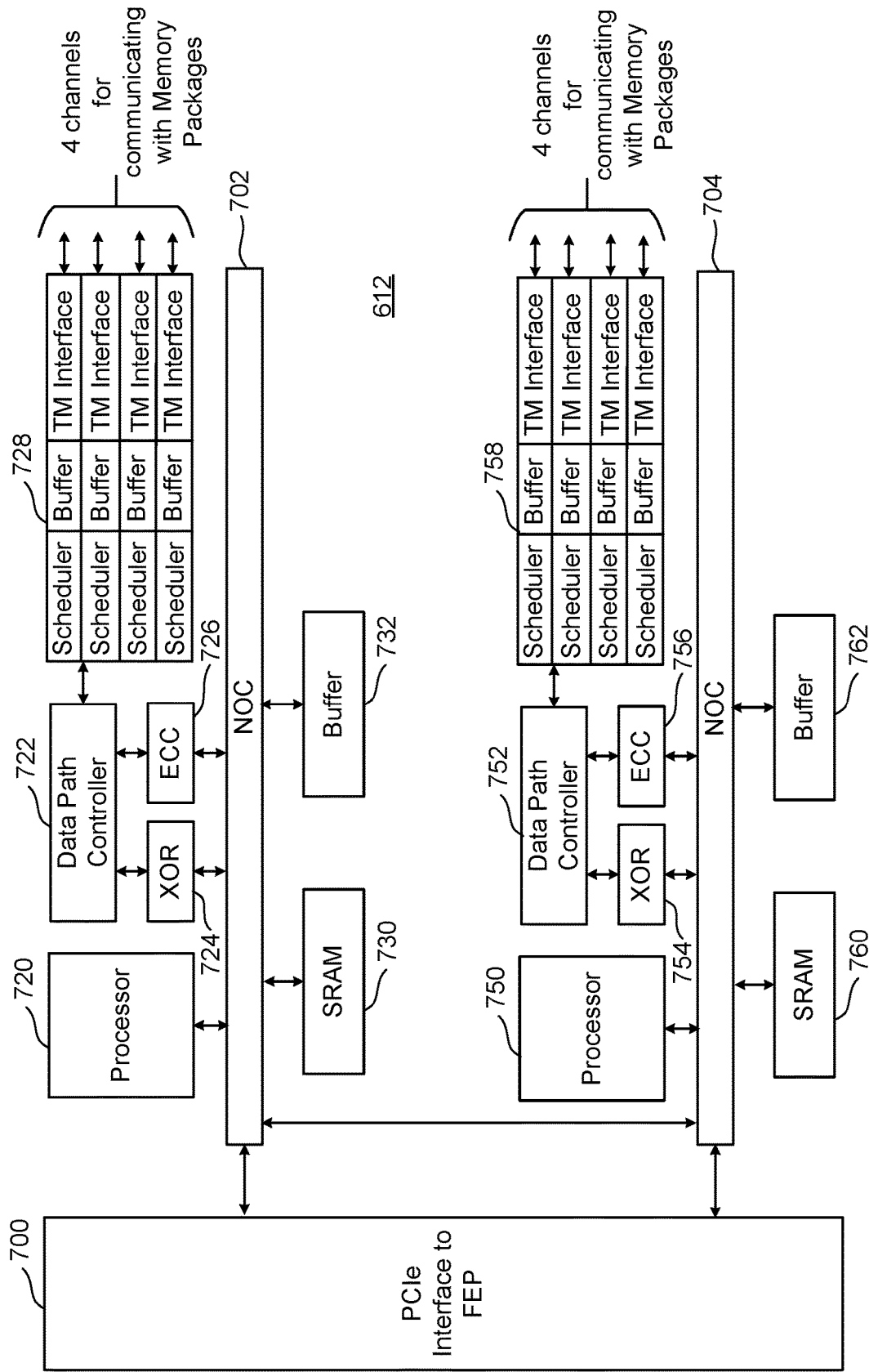
FIG. 7 is a block diagram of one embodiment of a Back End Processor Circuit. In some embodiments, the Back End Processor Circuit is part of a Controller.

FIG. 6B is a block diagram of one embodiment of FEP circuit 610. FIG. 6B shows a PCIe interface 650 to communicate with host 620 and a host processor 652 in communication with that PCIe interface. The host processor 652 can be any type of processor known in the art that is suitable for the implementation. Host processor 652 is in communication with a network-on-chip (NOC) 654. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 654 is the memory processor 656, SRAM 660 and a DRAM controller 662. The DRAM controller 662 is used to operate and communicate with the DRAM (e.g., DRAM 606). SRAM 660 is local RAM memory used by memory processor 656. Memory processor 656 is used to run the FEP circuit and perform the various memory operations. Also in communication with the NOC are two PCIe Interfaces 664 and 666. In the embodiment of FIG. 6B, the SSD controller will include two BEP circuits 612; therefore there are two PCIe Interfaces 664/666. Each PCIe Interface communicates with one of the BEP circuits 612. In other embodiments, there can be more or less than two BEP circuits 612; therefore, there can be more than two PCIe Interfaces.

FIG. 7A is a block diagram of one embodiment of the BEP circuit 612. FIG. 7A shows a PCIe Interface 700 for communicating with the FEP circuit 610 (e.g., communicating with one of PCIe Interfaces 664 and 666 of FIG. 6B). PCIe Interface 700 is in communication with two NOCs (Network-on-a-Chip) 702 and 704. In one embodiment, the two NOCs can be combined to one large NOC. Each NOC (702/704) is connected to SRAM (730/760), a buffer (732/762), processor (720/750), and a data path controller (722/752) via an XOR engine (724/754) and an ECC engine (726/756). The ECC engines 726/756 are used to perform error correction, as known in the art. The XOR engines 724/754 are used to XOR the data so that data can be combined and stored in a manner that can be recovered in case there is a UECC failure. In an embodiment, XOR engines 724/754 form a bitwise XOR of different pages of data. The XOR result may be stored in a memory package 604. In the event that an ECC engine 726/756 is unable to successfully correct all errors in a page of data that is read back from a memory package 604, the stored XOR result may be accessed from the memory package 604. The page of data may then be recovered based on the stored XOR result, along with the other pages of data that were used to form the XOR result.

Data path controller 722 is connected to an interface module for communicating via four channels with memory packages. Thus, the top NOC 702 is associated with an interface 728 for four channels for communicating with memory packages and the bottom NOC 704 is associated with an interface 758 for four additional channels for communicating with memory packages. Each interface 728/758 includes four Toggle Mode interfaces (TM Interface), four buffers and four schedulers. There is one scheduler, buffer and TM Interface for each of the channels. The processor can be any standard processor known in the art. The data path controllers 722/752 can be a processor, FPGA, microprocessor or other type of controller. The XOR engines 724/754 and ECC engines 726/756 are dedicated hardware circuits, known as hardware accelerators. In other embodiments, the XOR engines 724/754 and ECC engines 726/756 can be implemented in software. The scheduler, buffer, and TM Interfaces are hardware circuits.

Interfaces 728/758, alone or in combination, may be referred to as a memory interface configured to be connected to non-volatile memory (e.g., memory package 604). A combination of one or more of processor 720/750, data path controller 722/752, XOR 724/754, ECC 726/756 may be referred to herein as a processor circuit. The buffer 732/762, SRAM 730/760, and/or NOCs 702/704 may also be considered to be a part of the processor circuit.

Figure 8:
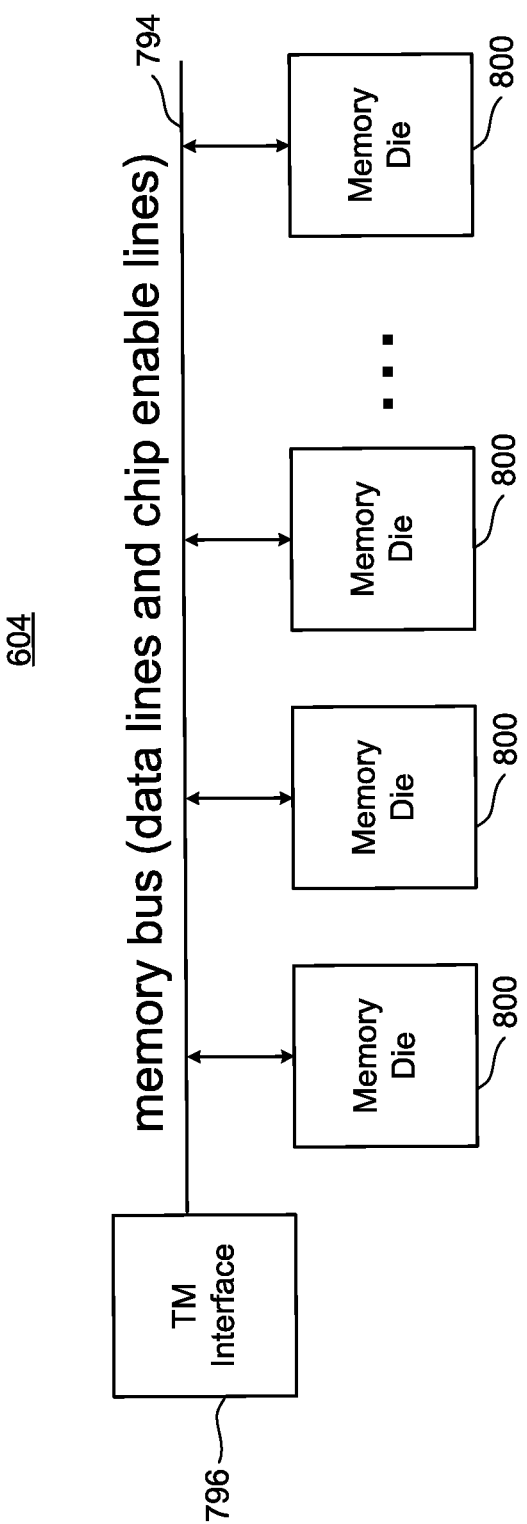
FIG. 8 is a block diagram of one embodiment of a memory package.

FIG. 8 is a block diagram of one embodiment of a memory package 604 that includes a plurality of memory die 800 connected to a memory bus (data lines and chip enable lines) 794. The memory bus 794 connects to a Toggle Mode Interface 796 for communicating with the TM Interface of a BEP circuit 612 (see e.g., FIG. 7). In some embodiments, the memory package can include a small controller connected to the memory bus and the TM Interface. The memory package can have one or more memory die. In one embodiment, each memory package includes eight or 66 memory die; however, other numbers of memory die can also be implemented. The technology described herein is not limited to any particular number of memory die.

Figure 9A:
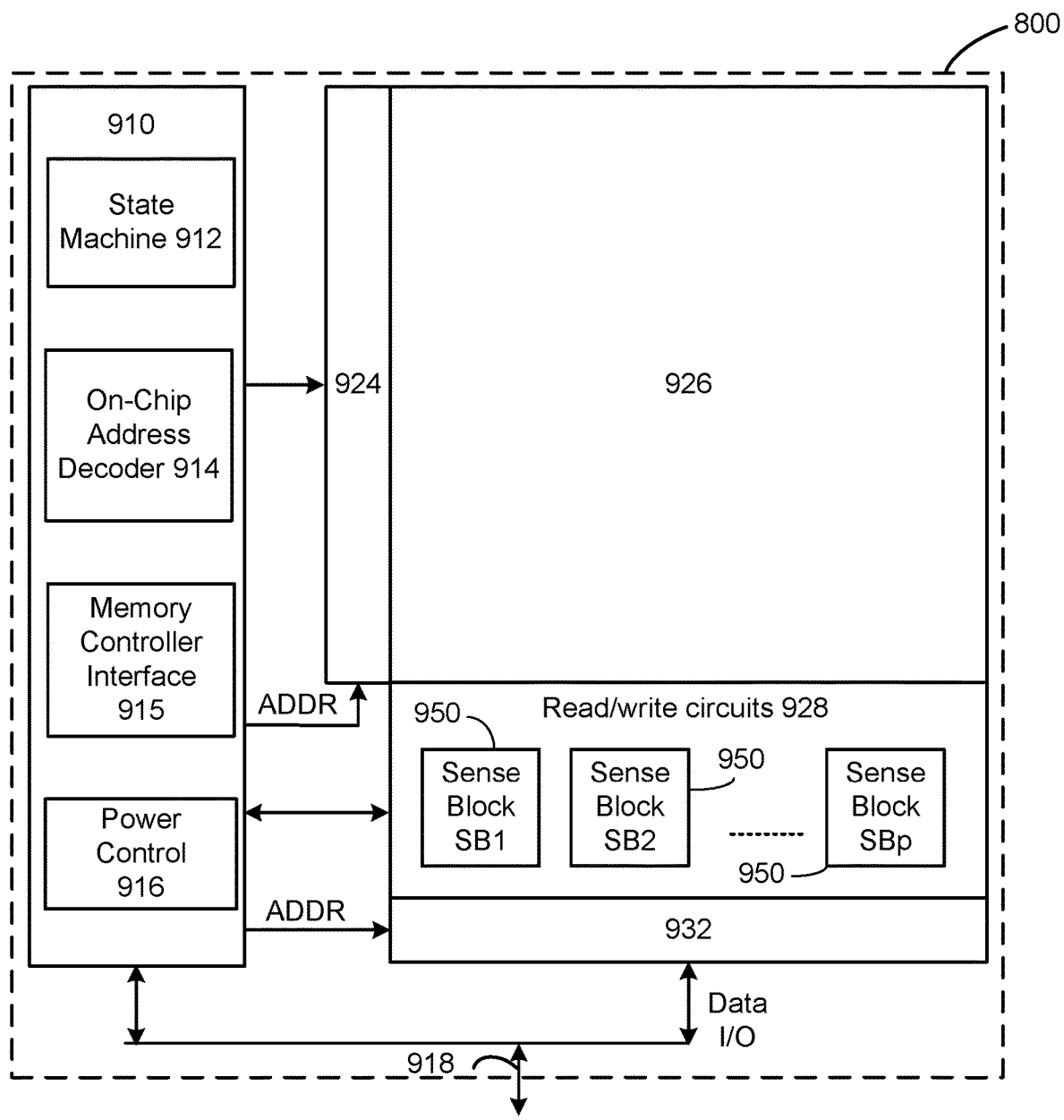
FIG. 9A is a block diagram of one embodiment of a memory die.

FIG. 9A is a functional block diagram of one embodiment of a memory die 800. Each of the one or more memory die 800 of FIG. 8 can be implemented as memory die 800 of FIG. 9A. The components depicted in FIG. 9A are electrical circuits. In one embodiment, each memory die 800 includes a memory structure 926, control circuitry 910, and read/write circuits 928, all of which are electrical circuits. Memory structure 926 is addressable by word lines via a row decoder 924 and by bit lines via a column decoder 932. The read/write circuits 928 include multiple sense blocks 950 including SB1, SB2, . . . , SBp (sensing circuitry) and allow a page (or multiple pages) of data in multiple memory cells to be read or programmed in parallel. In one embodiment, each sense block include a sense amplifier and a set of latches connected to the bit line. The latches store data to be written and/or data that has been read. The sense blocks include bit line drivers.

Commands and data are transferred between the controller 602 and the memory die 800 via memory controller interface 915. Examples of memory controller interface 915 include a Toggle Mode Interface and an Open NAND Flash Interface (ONFI). Other I/O interfaces can also be used.

Control circuitry 910 cooperates with the read/write circuits 928 to perform memory operations (e.g., write, read, erase, and others) on memory structure 926. In one embodiment, control circuitry 910 includes a state machine 912, an on-chip address decoder 914, a power control module 916, and a memory controller interface 915. State machine 912 provides die-level control of memory operations. In one embodiment, state machine 912 is programmable by software. In other embodiments, state machine 912 does not use software and is completely implemented in hardware (e.g., electrical circuits). In some embodiments, state machine 912 can be replaced by a microcontroller or microprocessor. In one embodiment, control circuitry 910 includes buffers such as registers, ROM fuses and other storage devices for storing default values such as base voltages and other parameters. The default values and other parameters could be stored in a region of the memory structure 926.

The on-chip address decoder 914 provides an address interface between addresses used by controller 602 to the hardware address used by the decoders 924 and 932. Power control module 916 controls the power and voltages supplied to the word lines and bit lines during memory operations. Power control module 916 may include charge pumps for creating voltages.

Memory controller interface 915 is an electrical interface for communicating with memory controller 602. For example, memory controller interface 915 may implement a Toggle Mode Interface that connects to the Toggle Mode interfaces of memory interface 228/258 for memory controller 602. In one embodiment, memory controller interface 915 includes a set of input and/or output (I/O) pins that connect to communication channel 918 (also refers to herein as a data bus). In one embodiment, communication channel 918 connects to the memory controller 602 as part of the Toggle Mode Interface.

For purposes of this document, control circuitry 910, alone or in combination with read/write circuits 928 and decoders 924/932, comprise one or more control circuits connected to memory structure 926. This one or more control circuits are an electrical circuit that performs the functions described below in the flow charts. In other embodiments, the one or more control circuits can consist only of controller 602 (or other controller), which is an electrical circuit in combination with software (e.g., firmware), that performs the functions described below in the flow charts. In one embodiment, the one or more control circuits is the controller where the controller is an electrical circuit that does not use hardware. In another alternative, the one or more control circuits comprises controller 602 and control circuitry 910 performing the functions described below in the flow charts. In another embodiment, the one or more control circuits comprises state machine 912 (and/or a microcontroller and/or microprocessor) alone or in combination with controller 602. In another alternative, the one or more control circuits comprises controller 602, control circuitry 910, read/write circuits 928 and decoders 924/932 performing the functions described below in the flow charts. In other embodiments, the one or more control circuits comprises one or more electrical circuits that operate the non-volatile memory. The term apparatus as used herein may include, but is not limited to, memory die 800, non-volatile memory 604, storage device 600, or a host system 620 that includes a storage device 600.

In one embodiment, memory structure 926 comprises a monolithic three-dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 926 comprise vertical NAND strings with charge-trapping material such as described, for example, in U.S. Pat. No. 9,721, 662, incorporated herein by reference in its entirety. In another embodiment, memory structure 926 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 926 is not limited to the examples above. Many different types of memory array architectures or memory cell technologies can be used to form memory structure 926. No particular non-volatile memory technology is required for purposes of the new claimed embodiments proposed herein. Other examples of suitable technologies for memory cells of the memory structure 926 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 926 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A storage device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a $Ge_2Sb_2Te_5$ alloy to achieve phase changes by electrically heating the phase change material. The doses of programming are electrical pulses of different amplitude and/or length resulting in different resistance values of the phase change material.

A person of ordinary skill in the art will recognize that the technology described herein is not limited to a single specific memory structure, but covers many relevant memory structures within the spirit and scope of the technology as described herein and as understood by one of ordinary skill in the art.

Figure 9B:
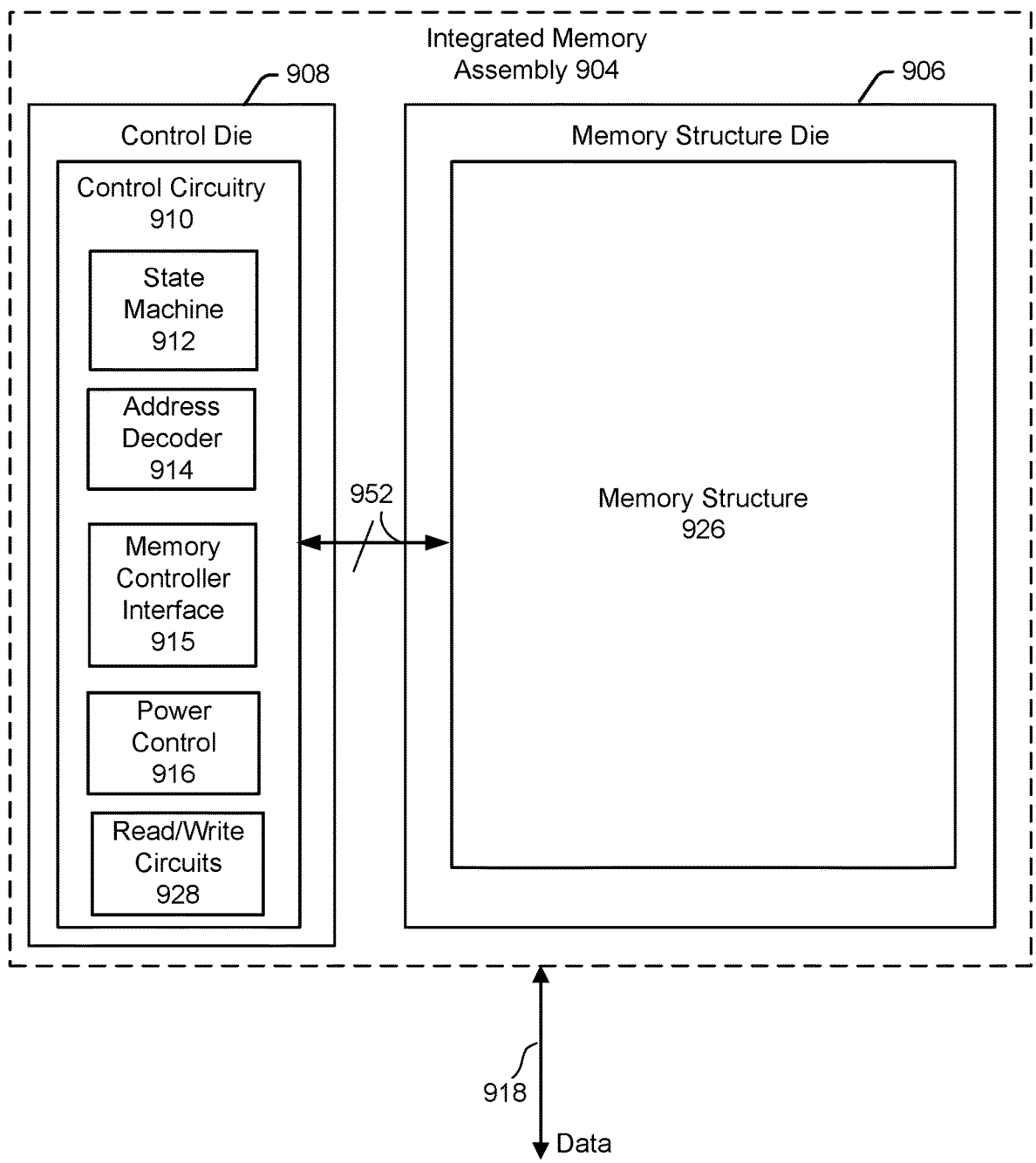
FIG. 9B depicts a functional block diagram of one embodiment of an integrated memory assembly.

FIG. 9B depicts a functional block diagram of one embodiment of an integrated memory assembly 904. The integrated memory assembly 904 may be used in a memory package 604 in memory system 600. In one embodiment, the integrated memory assembly 904 includes two types of semiconductor die (or more succinctly, "die"). Memory structure die 906 includes include memory structure 926. Memory structure 926 may contain non-volatile memory cells. Control die 908 includes control circuitry 910. In some embodiments, the memory structure die 906 and the control die 908 are bonded together. The control circuitry includes state machine 912, an address decoder 914, a power control circuit 916, and memory controller interface 915. The control circuitry also includes read/write circuits 928. In another embodiment, a portion of the read/write circuits 928 are located on control die 908, and a portion of the read/write circuits 928 are located on memory die 906.

Any subset of components in the control circuitry 910 can be considered one or more control circuits. The one or more control circuits can include hardware only or a combination of hardware and software (including firmware). For example, a controller programmed by firmware is one example of a control circuit. One or more control circuits can include a processor, PGA (Programmable Gate Array, FPGA (Field Programmable Gate Array), ASIC (Application Specific Integrated Circuit), integrated circuit or other type of circuit.

Pathways 952 are pathways between one or more components in the control circuitry 910 and the memory structure on memory structure die 906. A pathway may be used to provide or receive a signal (e.g., voltage, current). A pathway includes an electrically conductive path. A pathway may include one or more of, but is not limited to, a bond pad, metal interconnect, via, transistor, electrically conducting material and other material that may transfer or carry an electrical signal.

In one embodiment, integrated memory assembly 904 includes a set of input and/or output (I/O) pins that connect to communication channel 918 (also refers to herein as a data bus). Communication channel 918 is depicted as being connected to integrated memory assembly 904 for generality. Communication channel 918 may connect to either or both of die 906 and/or 908. In one embodiment, communication channel 918 connect the memory controller 602 directly to control die 908. In one embodiment, the memory controller interface 915 on the control die 908 performs skew correction, as described herein, for signals received over communication channel 918.

Figure 10:
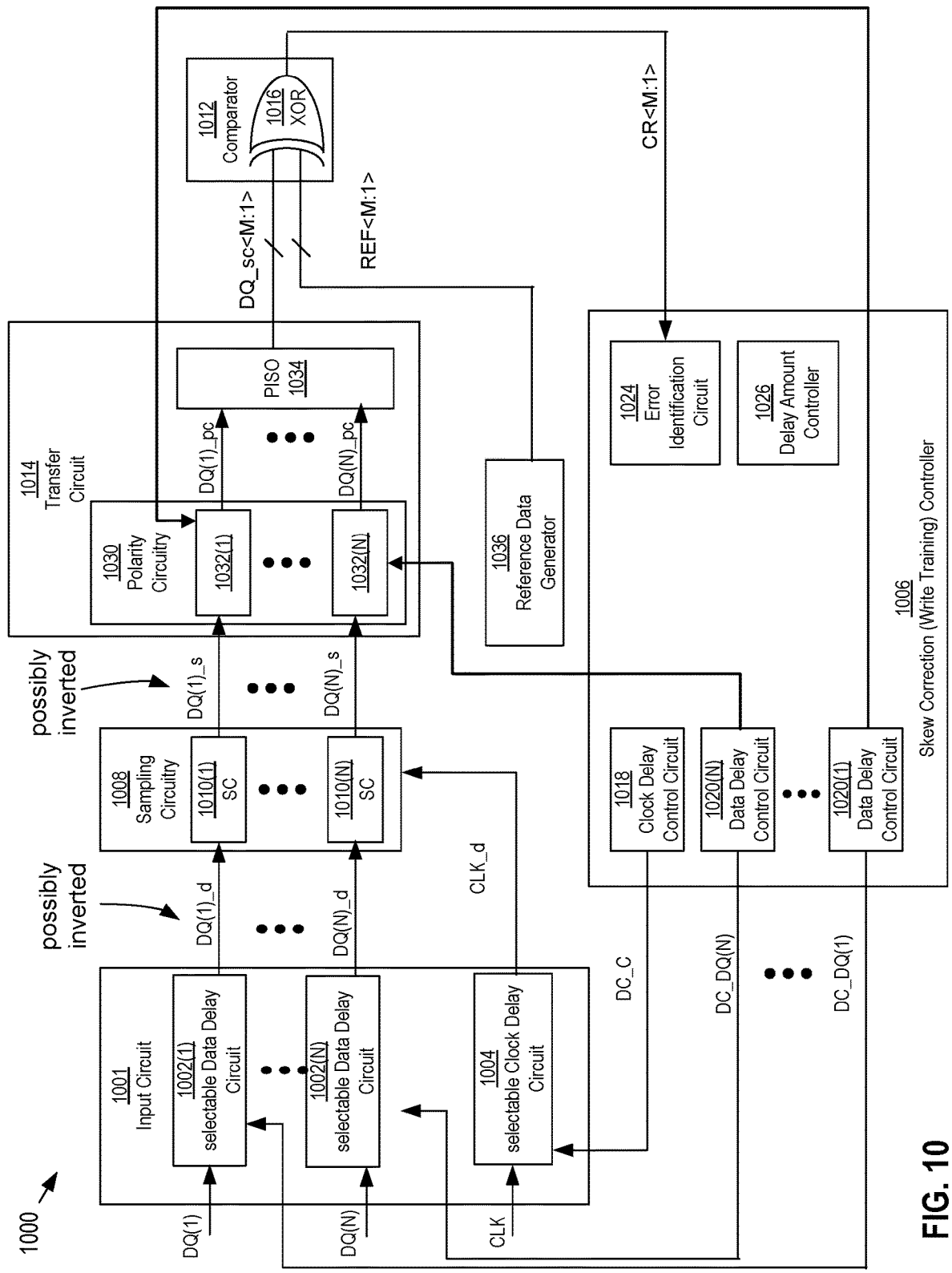
FIG. 10 is a block diagram of one embodiment of a skew correction system.

FIG. 10 shows a block diagram of one embodiment of a skew correction system 1000 configured to perform skew correction processes. A skew correction process is a process that reduces skew between a clock signal and a data signal.

In addition or alternatively, a skew correction process is a process that moves sampling times of a clock signal closer to target sampling times to sample data pulses of a data signal. In one embodiment, the skew correction system 1000 is implemented in whole, or in part, within memory controller interface 915. In one embodiment, the skew correction system 1000 is implemented in whole, or in part, within TM interface 796.

The embodiments of the skew correction system 1000 described herein correct for skew between the input clock signal CLK and input data signals DQ. In one embodiment of a skew correction process, the skew correction system 1000 corrects for skew by first delaying the input clock signal CLK by a reference clock delay amount to generate a delayed clock signal CLK_d. Then, the skew correction system delays the input data signals DQ to determine target data delay amounts, relative to the reference clock delay amount, that position sampling transitions of the delayed clock signal CLK_d in target sampling positions.

Since different input data signals DQ may have different amounts of skew relative to the clock signal CLK, the skew correction system 1000 is configured to independently control or adjust the delay of each of the input data signals DQ. During the skew correction process, the skew correction system 1000 may identify a first data delay amount for each input data signal DQ that identifies and upper bound of data valid window $T_{DVW}$ (see FIG. 4) and a second data delay amount that identifies a lower bound of the data valid window $T_{DVW}$. Through independent control of the delay, the skew correction system 1000 may independently determine data valid windows $T_{DVW}$ for each input data signal DQ, but determines each of the data valid windows $T_{DVW}$ with reference to the same reference clock delay amount. Upon identifying the first and second data delay amounts for each input data signal DQ, and in turn the data valid window $T_{DVW}$, the skew correction system 1000 identifies middle positions of the data valid window $T_{DVW}$ by averaging the first and second data delay amounts. The skew correction system 1000 identifies the average as the target data delay amount that position the sampling transition of the delayed clock signal CLK_d in a target sampling position when the input clock signal CLK is delayed by the reference clock delay amount.

As a matter of overview, the skew correction system 1000 has an input circuit 1001, which receives a number of input data signals DQ(1)-DQ(N), as well as a clock signal CLK. The input circuit 1001 includes selectable data delay circuits 1002(1)-1002(n), which are each configured to provide a selectable amount of delay for each input data signals DQ(1)-DQ(N). The input circuit 1001 also includes a selectable clock delay circuit 1004 which is configured to provide a selectable amount of delay for the clock signal CLK. The skew correction controller 1006 has data delay control circuits 1002(1) to 1002(N), which are configured to output delay control signals DC_DQ(1) to DC_DQ(N) to control the delays of the selectable data delay circuits 1002(1)-1002(n). The skew correction controller 1006 has clock delay control circuit 1018, which is configured to output clock delay control signal DC_C to control the delay of the selectable clock delay circuits 1004. Briefly, the delayed signals DQ(1)_d to DQ(N)_d from the input circuit 1001 are sampled by sampling circuitry 1008, which provides sampled signals DQ(1)_s to DQ(N)_s to transfer circuit 1014. Based on the sampled signals DQ(1)_s to DQ(N)_s, the transfer circuit 1014 provides a serialized signal DQ_sc<M:1> to the comparator 1012. The comparator 1012 compares the serialized signal DQ_sc<M:1> with a reference signal REF<M:1> and provides a comparison result signal CR<M:1> to the skew correction controller 1006. The skew correction controller 1006 analyzes the comparison result signal to determine how to correct skew between the clock signal CLK and the input data signals DQ(1)-DQ(N). For example, the skew correction controller 1006 may scan through various amounts of delay, and analyze the comparison result signal CR<M:1> for each amount of delay to determine whether the amount of delay results in the input data signal being in the data valid window $T_{DVW}$ (see FIG. 4).

Further details of the input circuit 1001 will now be discussed. As noted, the input circuit 1001 includes selectable data delay circuits 1002(1)-1002(N), and a selectable clock delay circuit 1004. In general, a delay circuit is a circuit that delays an input signal by an amount of delay to generate and output a delayed signal. Where the delay circuit receives and delays a clock signal, the delay circuit is referred to as a clock delay circuit. Where the delay circuit receives and delays a data signal, the delay circuit is referred to as a data delay circuit. Additionally, where the input signal is clock signal, the delayed signal is referred to as a delayed clock signal. Where the input signal is a data signal, the delayed signal is referred to as a delayed data signal.

The input signal that a delay circuit receives includes a sequence of pulses. For example, an input clock signal includes a sequence of clock pulses, and an input data signal includes a sequence of data pulses. A delay circuit includes an input terminal at which the delay circuit receives the input signal and an output terminal at which the delay circuit outputs the delayed signal. In addition, the delay circuit is configured with a delay having an amount (referred to as a delay amount), which is the amount by which the delay circuit delays the input signal to generate the delayed signal at its output terminal. Accordingly, the delay circuit generates the delayed signal at its output terminal by delaying each of the pulses of the input signal by the delay amount. In addition, a selectable delay circuit is a delay circuit that receives a select signal to select the amount of its delay.

In some embodiments, the selectable data delay circuits 1002 comprise a number of inverters. Each inverter is configured to delay the data signal by a pre-determined amount of time. In some embodiments, a selectable data delay circuit 1002 could pass the data signal through either an odd number of inverters or through an even number of inverters. In the event that the data signal is passed through an odd number of inverters, then the data signal will be inverted at the output of the selectable data delay circuit 1002. For example, if the data signal appears at the input of the selectable data delay circuit 100 as in the example data signal of FIG. 2A, then the inverted data signal will appear as in the example inverted data signal of FIG. 2B.

As shown in FIG. 10, the selectable delay circuits 1002 includes selectable data delay circuit 1002(1) to 1002(N), each configured to delay a respective input data signal DQ(1) to DQ(N), and a selectable clock delay circuit 1004 configured to delay the clock signal CLK. If the clock signal CLK has a pair of complementary input clock signals CLK, CLKB, the selectable clock delay circuit 1004 may include a pair of selectable clock delay circuits, each configured to delay a respective one of the pair of complementary input clock signals CLK, CLKB. For simplicity, in the example configuration shown in FIG. 10, the selectable delay circuits includes a single selectable clock delay circuit 1004 configured to delay a single-ended input clock single CLK.

Figure 13:
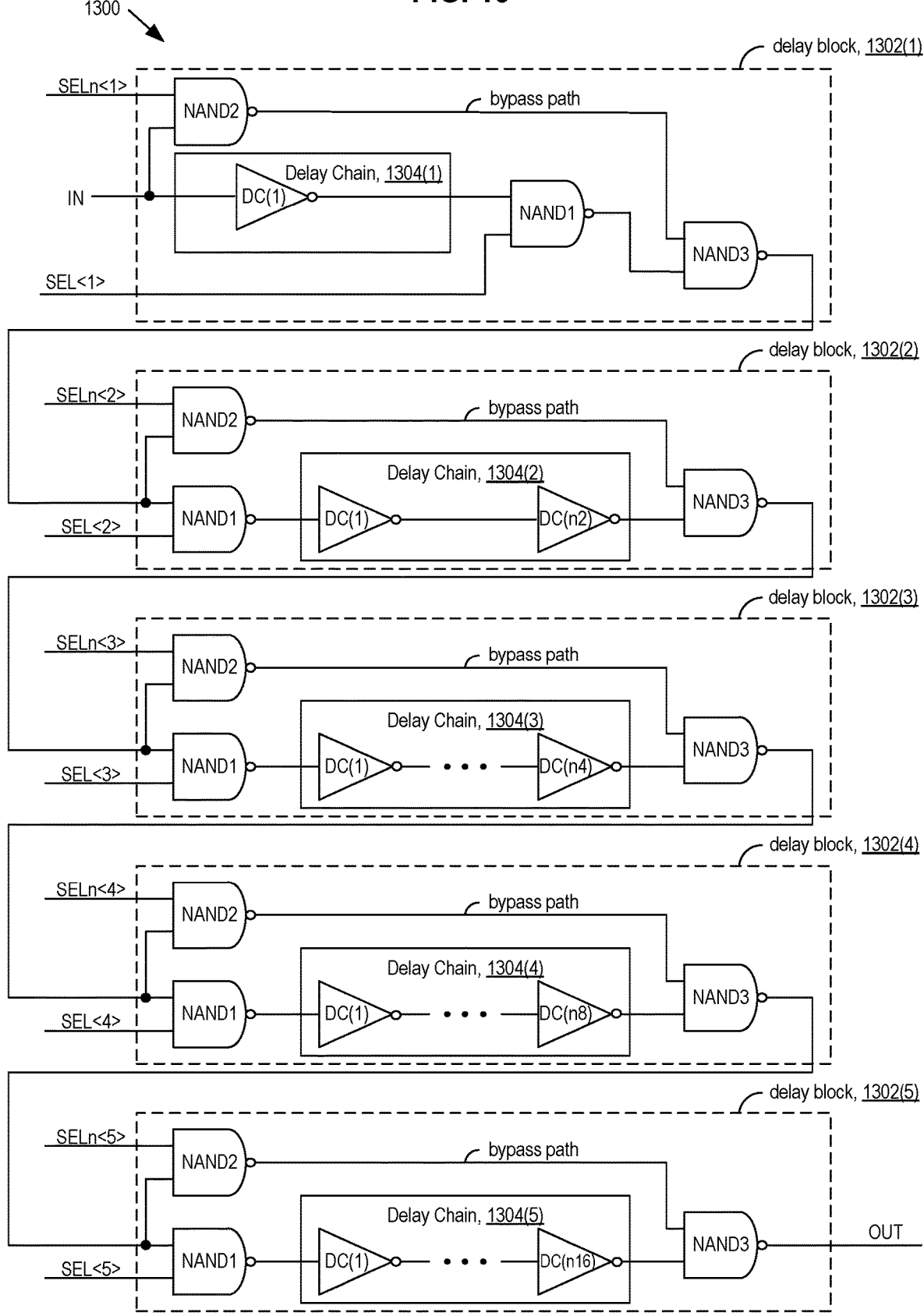
FIG. 13 shows a block diagram of one embodiment of a selectable delay circuit.

Additionally, each of the selectable delay circuits 1002, 1004 is configured to delay a respective input signal DQ, CLK to generate a respective delayed signal. For example, a first selectable data delay circuit 1002(1) is configured to delay a first input data signal DQ(1) to generate a first delayed data signal DQ(1)_d, an Nth selectable data delay circuit 1002(N) is configured to delay an Nth input data signal DQ(N) to generate an Nth delayed data signal DQ(N)_d, and the selectable clock delay circuit 1004 is configured to delay the input clock signal CLK to generate a delayed clock signal CLK_d. Each of the delayed data signals DQ(1)_d to DQ(N)_N is possibly inverted relative to the corresponding input data signal DQ(1) to DQ(N). In some embodiments, the delayed data signal will be inverted if the data signal was passed through an odd number of inverters. As will be discussed more fully in connection with FIG. 13, passing the data signal through an odd number of inverters can provide for greater resolution in the amount of delay. Increasing the delay resolution improves the ability of to position the transition of the clock signal closer to the target position. FIG. 13, to be discussed below, depicts one embodiment of a selectable data delay circuit 1002.

Further details of the skew correction controller 1006 will now be discussed. The skew correction controller 1006 controls skew correction processes. The skew correction controller 1006 may comprise hardware, firmware (or software), or a combination of hardware and firmware (or software). For example, a skew correction controller may include or be a component of an integrated circuit (IC), such as an application specific integrated circuit (ASIC) or a field programmable gate array (FPGA), a circuit, a digital logic circuit, an analog circuit, a combination of discrete circuits, gates, or any other type of hardware or combination thereof. In addition, or alternatively, a skew correction controller may include memory hardware that comprises instructions executable with a processor or processor circuitry to implement one or more of the features of the program controller. A skew correction controller, which may be an on-die skew correction controller in certain embodiments, can take the form of processing circuitry, a microprocessor or processor, and a computer-readable medium (e.g., a non-transitory computer readable storage medium) that stores computer-readable program code (e.g., software or firmware) executable by the (micro)processor, logic gates, switches, an application specific integrated circuit (ASIC), a programmable logic controller, and an embedded microcontroller.

The skew correction controller 1006 determines when to perform skew correction processes, including when to start a skew correction process, when to end a skew correction process, and when to transition between different delay phases of a skew correction process. For example, as described in further detail below, the skew correction controller 1006 can control the delay of the selectable clock delay circuit 1004, including when to delay the selectable clock delay circuit 1004 (including when to start delaying the selectable clock delay circuit 1004 and when to stop delaying the selectable clock delay circuit 1004), how much to have the selectable clock delay circuit 1004 delay the clock signal CLK to generate the delayed clock signal CLK_d, including whether and/or how much to increase the clock delay amount or decrease the clock delay amount.

Similarly, the skew correction controller 1006 controls the delay of the selectable data delay circuits 1002, including when to delay the selectable data delay circuits 1002 (including when to start delaying the selectable data delay circuit 1002 and when to stop delaying the selectable data delay circuits 1002), and how much to have the selectable data delay circuits 1002 delay their respective input data signals DQ to generate the delayed data signals DQ_d, including whether and/or how much to increase the data delay amounts or decrease the data delay amounts.

Additionally, the skew correction controller 1006 is configured to control the selectable data delay circuits 1002 independent from each other. In addition, through its control of the selectable data and clock delay circuits 1002, 1004, the skew correction controller 1006 controls the delay amounts by which the input clock and data signals CLK, DQ are delayed. Accordingly, the skew correction controller 1006 delays the input data signals DQ by way of the selectable data delay circuits 1002, and delays the input clock signal CLK by way of the selectable clock delay circuit 1004.

In addition, the skew correction controller 1006 is configured to control the delay of the selectable data and clock delay circuits 1002, 1004 through output of delay control signals DC to the selectable delay circuits 1002, 1004. For example, the skew correction controller 1006 is configured to output a first data delay control signal DC_DQ(1) to the first selectable data delay circuit 1002(1), an Nth data delay control signal DC_DQ(N) to the Nth selectable data delay circuit 1002(N), and a clock delay control signal DC_C to the selectable clock delay circuit 1004.

The delay control signals DC may be analog signals or digital signals, depending on the configuration of the selectable data and clock delay circuits 1002, 1004. For configurations where the skew correction controller 1006 outputs the delay control signals DC as analog signals, the skew correction controller 1006 may set the levels or magnitudes, such as voltage levels or magnitudes, of the delay control signals DC in order to set the delays of the selectable data and clock delay circuits 1002, 1004 to certain delay amounts.

For configurations where the skew correction controller 1006 outputs the delay control signals DC as digital signals, the skew correction controller 1006 may output the delay control signals DC as digital codes. Each digital code DC may represent a p-bit binary number, where p is the number of digits of the p-bit binary number, and where each digit can be a logic 0 value or a logic 1 value.

The given selectable delay circuit 1002, 1004 may respond to the digital code by delaying its respective input data or clock signal DQ, CLK by a delay amount that corresponds to the current value of the p-bit number represented by the digital code. When the skew correction controller 1006 wants to change the amount of the delay by which the given selectable delay circuit 1002, 1004 is delaying its respective data or clock signal DQ, CLK, the skew correction controller 1006 changes the digital value of the digital code.

In one embodiment, a general flow for the skew connection controller 1006 is to first delay the clock signal CLK until all data signals DQ(1) to DQ(N) fall into a DQ hold failure from a no failure. The same clock delay is used for all DQ(1) to DQ(N). Next, each of the input data signals DQ(1) to DQ(N) is delayed independent of the others to change from the hold failure to a no hold failure. For example, the delay for each input data signals DQ is gradually increased until there is a no longer hold failure. This, in effect, determines one end of the data valid window $T_{DVW}$ for each input data signal DQ. This "first delay" for each input data signal DQ is recorded. Then, the input data signals DQ(1) to DQ(N) is delayed independent of the others to change from the no failure to it setup failure. For example, the delay for each input data signals DQ is gradually increased until there is a setup failure. This, in effect, determines the other end of the data valid window $T_{DVW}$ for each input data signal DQ. This "second delay" for each input data signal DQ is recorded. The target delay for each input data signals DQ may then be computed based on the first delay and the second delay. For example, the target delay may be the (first delay time+second delay time)/2. The target delay will center the data signal in the middle of the data valid window $T_{DVW}$. In some embodiments, the delay amount memory controller 602 performs the general flow and computes the various delays.

Further details of the sampling circuitry 1008 will now be discussed. The sampling circuitry 1008 is configured to sample data pulses of the delayed data signals DQ(1)_d to DQ(N)_d in response to sampling transitions of the delayed clock signal CLK_d. That is, the sampling circuitry 1008 samples the delayed data signals DQ_d in response to the sampling transitions of the delayed clock signal CLK_d, instead of sampling the input data signals DQ in response to the input clock signal CLK.

The sampling circuitry 1008 may include sampling circuits (SC) 1010(1) to 1010(N), each configured to sample data pulses of one of the delayed data signals DQ(1)_d to DQ(N)_d in response detection of sampling transitions of the delayed clock signal CKL_d. In addition, each of the sampling circuits 1010(1) to 1010(N) is configured to output a sampled data signal DQ(1)_s to DQ(N)_s at levels indicative of the levels of the respective delayed data signals DQ(1)_d to DQ(N)_d it sampled. Each sampled data signal DQ(1)_s to DQ(N)_s will be inverted (relative to the corresponding data signal DQ) if the corresponding delayed data signal is inverted (relative to the corresponding data signal DQ). In some embodiments, each sampling circuit SC 1010 is implemented with a latch. FIG. 3 depicts one embodiment of a sampling circuit SC 1010.

Further details of the transfer circuit 1014 will now be discussed. In one embodiment, transfer circuit 1014 converts the parallel format of the sampled data signals DQ(1)_s to DQ(N)_s into a serial format signal DQ_sc<M:1>. The serial format signal DQ_sc<M:1> is provided to comparator 1012. The serial format signal DQ_sc<M:1> may also be provided to circuitry (not depicted in FIG. 10), which uses the serial format signal DQ_sc<M:1> to write data to non-volatile memory cells in the memory structure 926.

The transfer circuit 1014 contains polarity circuitry 1030, which is configured to correct the polarity of the data signals, if necessary. The polarity circuitry 1030 contains a polarity correction circuit 1032(1) to 1032(N) for each sampled data signals DQ(1)_s to DQ(N)_s. Each polarity correction circuit 1032 inputs one of the sampled data signals and outputs a polarity corrected data signal. For example, polarity correction circuit 1032(1) inputs sampled data signal DQ(1)_s and outputs polarity corrected data signal DQ(1)_pc. Likewise, polarity correction circuit 1032(N) inputs sampled data signal DQ(N)_s and outputs polarity corrected data signal DQ(N) pc. In the event that the sampled data signal DQ(1)_s to DQ(N)_s is inverted relative to the corresponding input data signal DQ(1) to DQ(N), then the polarity correction circuit 1032 inverts the sampled data signal. If the sampled data signal DQ(1)_s to DQ(N)_s is not inverted relative to the corresponding input data signal DQ(1) to DQ(N), then the polarity correction circuit 1032 does not invert the sampled data signal. Note that whether or not the polarity correction circuit 1032 inverts the sampled data signal DQ_s, the output of the polarity correction circuit 1032 is referred to herein as a polarity corrected data signal DQ_pc. In one embodiment, each polarity correction circuit 1032 contains a multiplexer (MUX).

Figure 12:
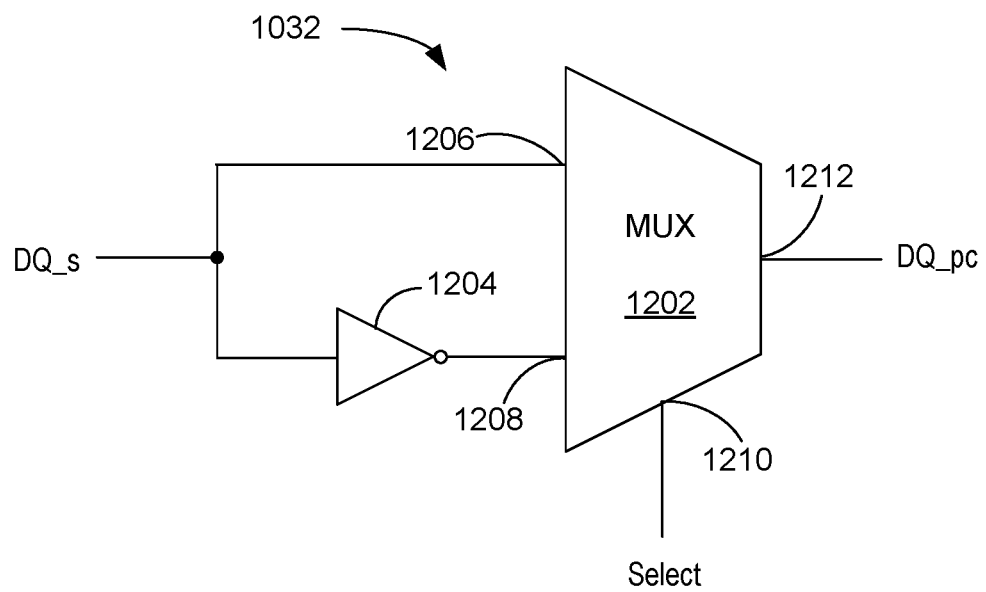
FIG. 12 depicts one embodiment of a polarity correction circuit.

Each polarity correction circuit 1032 receives a control signal from one of the data delay control circuits 1020. For example, polarity correction circuit 1032(1) receives a control signal from one data delay control circuits 1020(1), and polarity correction circuit 1032(N) receives a control signal from one data delay control circuits 1020(N). The control signal selects whether or not the polarity correction circuit 1032 inverts the sampled data signal. The polarity correction circuit 1032 will know whether the sampled data signal should be inverted based on the data delay control signal DC_DQ that was sent to the selectable data delay circuit 1002 that corresponds to the polarity correction circuit 1032. Further details of one embodiment of a polarity correction circuit 1032 are depicted in FIG. 12, which will be discussed below.

In one embodiment, the transfer circuit 1014 contains a parallel-in, serial-out circuitry (PISO) 1034, to create the serial format signal DQ_sc<M:1>. The PISO 1034 inputs each polarity corrected data signal DQ(1)_pc to DQ(N)_pc, and outputs the serial format signal DQ_sc<M:1>. The transfer circuit 1014 may also be configured to transfer data in the output direction. For example, the transfer circuit 1014 may be configured to receive data that is read from memory structure 926 and change the data from a serial to parallel. In one embodiment, the transfer circuit 1014 contains serial-in, parallel-out circuitry (SIPO) to create a parallel output signal from a serial signal. The parallel output signal may be provided to the memory controller 602.

The comparator circuit 1012 is configured to compare the combined sampled data signal DQ_sc with a reference data signal REF. The combined sampled data signal DQ_sc is a combination of at least some of the sampled data pulses of the sampled data signals DQ(1)_s to DQ(N)_s. In some example configurations, the combined sampled data signal DQ_sc includes an M-number of data pulses, each corresponding to one of the data pulses of one of the sampled data signals DQ(1)_s to DQ(N)_s. In addition or alternatively, the combined sampled data signal DQ_sc may be considered an M-bit digital signal, with each bit of the M-number of bits represented by one of the M-number of pulses. In some example configurations, the M-number of pulses are communicated on an M-number of parallel data lines.

In particular example configurations, the M-number of bits is equal to the N-number of sampling circuits 1010 multiplied by the number of sampling actions each of the sampling circuits 1010 performed over a given time period during which each sampling circuit 1010 performs a P-number of sampling actions. That is, over a given period of time, each sampling circuit 1010 samples a respective delayed data signal DQ_d P times. Accordingly, the number of bits M is equal to the total number of sampling actions that the sampling circuitry 1008 performs over the given time period.

To illustrate, suppose the sampling circuitry 1008 includes eight sampling circuits 1010(1) to 1010(8) (N=8), and over a given period of time, each sampling circuit 1010 samples its respective delayed data signals DQ_d eight times (P=8). Accordingly, M is 104—i.e., the sampling circuitry 1008 performed 104 sampling actions over the given time period, and the combined sampled signal DQ_sc<64:1> that the comparator circuit 1012 receives to identify the sampling errors is a 104-bit digital signal.

The reference data signal REF includes data pulses that indicate logic or data values of a reference bit sequence. The data values that the N-number of data signals DQ(1) to DQ(N) carry may form a bit sequence that matches the reference bit sequence. The combined sampled signal DQ_sc also carries a bit sequence indicated by the levels of the data pulses of the combined sampled signal DQ_sc. The bit sequence carried by the combined sampled signal DQ_sc is referred to as a sampled bit sequence.

The skew correction system 1000 may further include reference data generator 1036 that generates bits comprising the reference bit sequence. The skew correction controller 1006 may control the generation of the reference data signal REF based on the data bits generated by reference data generator 1036. In some embodiments, the reference data generator 1036 uses a seed pattern address from the memory controller 602 to generate the reference bit sequence. In some example configurations, circuit components of the transfer circuit 1014 are used to convert the reference data signal REF into an M-bit format that can be compared with the combined sampled data signal DQ_sc. Note that the input data signal DQ that was sent by the memory controller 602 during training is also based on the seed pattern address.

As mentioned, the comparator circuit 1012 is configured to compare the combined sampled signal DQ_sc with the reference data signal REF to identify sampling errors. For configurations where the combined sampled data signal DQ_s is in the form of an M-bit signal, the reference signal REF may also be in the form of an M-bit signal. To identify the sampling errors, the comparator circuit 1012 is configured to compare each sampled data pulse of the combined sampled signal DQ_sc with a corresponding pulse of the reference signal REF. If the levels of two pulses being compared match, then the comparator circuit 1012 determines that whichever sampling circuit 1010 produced that sampled data pulse did not make a sampling errors. On the other hand, if the levels of the two pulses being compared do not match, then the comparator circuit 1012 determines that whichever sampling circuit produced that sampled data pulse made a sampling error.

Accordingly, if the sampling circuits 1010 do not perform any sampling errors when sampling the delayed data signals DQ_d, then the M-bit sampled bit sequence indicated by the data pulses of the combined sampled data signal DQ_sc matches the M-bit reference bit sequence indicated by the data pulses of the reference data signal REF. On the other hand, if the sampling circuits 1010 perform at least one sampling error, then the M-bit sampled bit sequence will not match the M-bit reference bit sequence. Instead, at least one bit between the M-bit sampled bit sequence and the M-bit reference bit sequence will be different. The number of bits that are different and which bits of the M-bit sequences are different from each other will depend on which of the sampling circuits 1010(1) to 1010(N) performed the sampling error(s) and how many sampling errors each of the sampling circuits 1010(1) to 1010(N) made.

The comparator circuit 1012 is configured to output a comparison result signal CR to the skew correction controller 1006 that identifies sampling errors performed by the sampling circuits 1010. In particular example configurations, the comparison result signal CR is in the form of an M-bit digital signal indicating an M-number of sampling results. As used herein, a sampling result is a result of a sampling action performed by a sampling circuit. A sampling result may be one of two types, either a sampling error or a sampling pass. As previously described, a sampling error is a result that a sampling circuit produces, generates, makes, or outputs in response to incorrectly sampling a level of an input data signal. A sampling pass is a result that a sampling circuit produces, generates, makes, or outputs in response to correctly sampling a level of an input data signal.

In some embodiments, the comparator 1012 includes an XOR logic gate circuit 1016 to identify the sampling errors. In particular, the XOR logic gate circuit 1016 may compare the data pulses of the combined sampled signal DQ_sc with corresponding data pulses of the reference signal REF. For a given data pulse of the combined sampled signal DQ_sc and a corresponding data pulse of the reference data signal REF, if the two data pulses have the same or matching levels (they are both at the high level or both at the low level), then the XOR logic circuitry 1016 outputs the comparison result signal CR at a logic low level indicating that the levels of the corresponding data pulses match. Alternatively, if the two corresponding data pulses have different levels (one is at the high level and the other is at the low level), then the XOR logic gate circuit 1016 outputs the comparison signal CR at a logic high level indicating that the levels of the corresponding data pulses are different (i.e., they do not match).

In order to perform a skew correction process, the skew correction controller 1006 may analyze a plurality of sampling actions performed by the sampling circuitry 1008 to determine how to delay the selectable delay circuits 1002, 1004. In the example configuration shown in FIG. 10, error identification circuit 1024 of the skew correction controller 1006 may receive a sampling analysis in the form of the M-bit comparison result signal CR<M:1>. As previously described, the M-number of bits of the comparison result signal CR may indicate an M-number of sampling actions and sampling results of the those sampling actions. In response to receipt of the M-bit comparison result signal CR<M:1>, the error identification circuit 1024 may identify a total number of sampling errors indicated by the comparison result signal CR<M:1> and a number of sampling errors performed by each of the sampling circuits 1010. The delay amount identification circuit 1026 receives results from the error identification circuit 1024 to be able to determine whether a data signal is in a hold failure, setup failure, no failure, etc.

Figure 11:
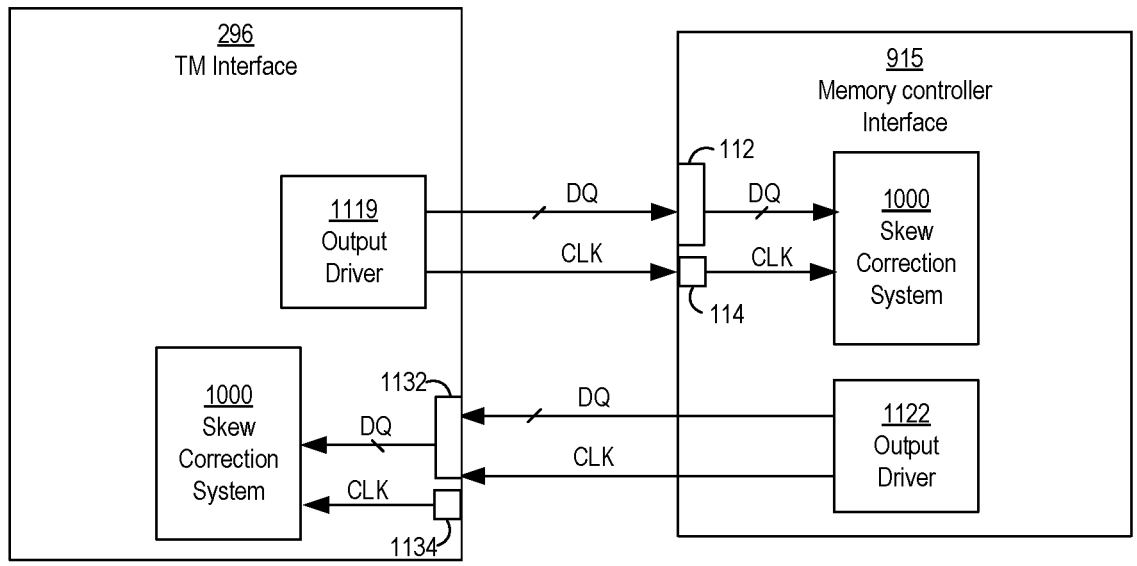
FIG. 11 depicts one embodiment in which a sending circuit includes a toggle mode (TM) interface and a receiving circuit includes a memory controller interface.

In some embodiments, the sending circuit 102 and the receiving circuit 104 are within a memory system. FIG. 11 depicts one embodiment in which the sending circuit includes a toggle mode (TM) interface 296 and the receiving circuit includes a memory controller interface 915. Recall that the TM interface 296 may reside within the memory controller 602. In one embodiment, the memory controller interface 915 resides on memory die 800. In one embodiment, the memory controller interface 915 resides on control die 908.

As shown in FIG. 11, the TM interface 296 includes an output driver 1119 and a skew correction system 1000. Likewise, the memory controller interface 915 includes an output driver 1122 and a skew correction system 1000. The memory controller interface 915 includes a set of input and/or output (I/O) pins that connect to communication channel 918. Those pins include data pins 112 and a clock pin 114. The TM interface 296 may also include a set of input and/or output (I/O) pins that connect to communication channel 918. Those pins include data pins 1132 and a clock pin 1134. For the controller 602 to program data stored in the memory structure 926, the controller 602 sends the data signal DQ that includes the data to be programmed along with a clock signal CLK via communications bus 918. The output driver 1119 outputs the data signals DQ and the clock signal CLK.

As part of or in advance of a receiver-side training process, such as a receiver-side write training process or a receiver-side read training process, the controller 602 may send a seed pattern address. The memory die 800 will use the seed pattern address to generate a reference pattern using a pattern generator (e.g., generator 1036). The skew correction system 1000 of the memory controller interface 915 performs a skew correction process to determine delay amounts for the selectable data and clock delay circuits that minimize skew. The skew correction system 1000 may use the reference data bits in order to perform the skew correction process. After the skew correction process is performed, the memory system 600 may enter into a normal operation mode in which the controller 602 can instruct the memory die 800 to write or program data into its memory structure 926.

Also, as shown in FIG. 11, in some example configurations, the TM interface 296 may also include a skew correction system 1000. FIG. 11 shows the skew correction system 1000 as a component of the TM interface 296, although other configurations may be possible. For the memory controller 602 wants to read data stored in the memory structure 926, the data may be communicated to an output driver circuit 1122 of the memory controller interface 915. The output driver 1122 may transmit data signals DQ that includes the data along with a clock signal CLK. The TM interface 296 may use the clock pulses of the clock signal CLK to identify the logic levels of the data signals DQ. The data and clock signals DQ, CLK from the memory controller interface 915 may be sent to the skew correction system 1000 of the TM interface 296, and the skew correction system 1000 of the TM interface 296 may delay the clock and data signals DQ, CLK by amounts determined from a prior skew correction process.

FIG. 12 depicts one embodiment of a polarity correction circuit 1032. The polarity correction circuit 1032 may be used in the polarity circuitry 1030 in the skew correction system 1000 depicted in FIG. 10. The polarity correction circuit 1032 has a multiplexer (MUX) 1202 and an inverter 1204. The MUX 1202 has a first input 1206, a second input 1208, a select input 1210, and an output 1212. A sampled data signal DQ_s is provided to the first input 1206 of the MUX 1202. The sampled data signal DQ_s is provided is also provided to the input of the inverter 1204. The output of the inverter 1204 is connected to the second input 1208 of the MUX 1202. Thus, the second input 1208 of the MUX 1202 receives an inverted version of the sampled data signal DQ_s. The select input 1210 receives a select signal to select either the first input 1206 or the second input 1208. The output 1212 of the MUX 1202 is the polarity corrected data signal DQ_pc. The select signal may be provided by the skew correction controller 1006. In particular, the select signal may be provided by one of the data delay control circuits 1020. The value of the data delay control signal DC_DQ will not only control the delay of the corresponding selectable data delay circuit 1002, but may be used to determine whether the selectable data delay circuit 1002 inverts the data signal or not. In one embodiment, the data delay control circuits 1020 determines whether the value of the data delay control signal DC_DQ will result in the selectable data delay circuit 1002 inverting the data signal. Thus, the value for the select signal may be chosen accordingly. In one embodiment, the select signal is a digital signal, having a value or either 0 or 1.

FIG. 13 shows a block diagram of one embodiment of a selectable delay circuit 1300. The selectable delay circuit 1300 may be used as the configuration for any of the selectable delay circuits 1002 or the clock delay circuit 1004 of FIG. 10. As shown in FIG. 13, the selectable delay circuit 1300 may be configured to receive an input signal IN, and delay the input signal IN to generate an output signal OUT, which is a delayed version of the input signal IN.

The delay circuit includes a number of delay blocks 1302. The example configuration shown in FIG. 13 includes five delay blocks 1302(1) to 1302(5), although numbers other than five may be used. The first delay block is configured to receive the input signal IN. The other blocks each have their respective input coupled to the output of a prior delay block 1302 of the selectable delay circuit 1300. Hence, the delay blocks 702 form a chain.

An input signal that each of the blocks 1302 receives is referred to as its local input signal. Except for the first delay block 1302(1), each of the blocks 1302 receives its local input signal from a prior delay block 1302 of the selectable delay circuit 1300. Additionally, an output signal that each of the blocks 1302 outputs is referred to as its local output signal. Except for the last, or fifth block 1302(5), each of the blocks 1302 may be configured to output a local output signal to a next block 1302 of the delay circuit 1300. Accordingly, the first delay block 1302(1) outputs a local output signal to the second delay block 1302(2), which the second delay block 1302(2) receives as its local input signal, the second delay block 1302(2) outputs a local output signal to the third delay block 1302(3), which the third delay block 1302(3) receives as its local input signal, and so on.

In addition, as shown in FIG. 13, each delay block 1302 includes a respective delay chain 1304 of delay cells (DC). Each delay cell provides a pre-determined amount of delay. In one embodiment, each delay cell includes an inverter. Hence, each delay cell inverts the data signal. In one embodiment, delay chain 1304(1) has one delay cell, delay chain 1304(2) has two delay cells, delay chain 1304(3) has four delay cells, delay chain 1304(4) has eight delay cells, and delay chain 1304(5) has 16 delay cells. Note that delay chain 1304(1) has an odd number of delay cell, whereas delay chains 1304(2)-1304(5) each have an even number of delay chains. Hence, delay chain 1304(1) will invert the data signal. However, none of delay chains 1304(2)-1304(5) will invert the data signal. Stated another way, delay chains 1304(2)-1304(5) will not invert the data signal.

In the embodiment depicted in FIG. 13, the numbers of delay cells increase by powers of two going from the first delay chain 1304(1) to the last delay chain 1304(5). For example, the first delay chain 1304(1) may include one delay cell, the second delay chain 1304(2) may include two delay cells, the third delay chain 1304(3) may include four delay cells, the fourth delay chain 1304(4) may include eight delay cells, and the fifth delay chain 1304(5) may include 16 delay cells. However, the delay chains could be chained in any order. Also, it is not required that each delay chain 1304 have a number of delay cell that is a power of two.

Each delay cell DC may provide a unit of delay, which may be measured in units of time, such as a number of nanoseconds or picoseconds, for example. Accordingly, the total amount of delay by which delay chain 1304 delays its local input signal is equal to the unit of delay of a delay cell DC multiplied by the number of delay cells of the delay chain.

In the example configuration shown in FIG. 13, each delay block 1302 includes three NAND gates, including a first NAND gate NAND1, a second NAND gate NAND2, and a third NAND gate NAND3. For delay block 1302(1) the input is provided to NAND2 and the delay cell DC(1) in the delay chain 1304(1). The first NAND gate NAND1 receives an output signal from the delay chain 1304(1). For the other ith blocks **1302(*i*)**, the first and second NAND gates NAND1, NAND2 each include a first input configured to receive a respective local input signal, and a second input terminal configured to receive a bit from an ith pair of complementary bits SEL<i>, SELn<i>. For example, in the configuration shown in FIG. 13, the first NAND gate NAND1 receives the ith selection signal SEL<i>, and the second NAND gate NAND2 receives the ith complementary selection signal SELn<i>. In accordance with the complementary configuration, an ith pair of complementary selections signals SEL<i>, SELn<i> have opposite logic 1 and logic 0 values. Additionally, for blocks other than 1302(1), the first NAND gate NAND1, which has its second input configured to receive the ith selection signal SEL<i>, has its output coupled to the input of the ith delay chain 1304(i). For all blocks 1302, the second NAND gate NAND2, which has its second input configured to receive the ith complementary selection signal SELn<i>, has its output coupled to the bypass path. For block 1302(1), the third NAND gate NAND3 includes a first input coupled to the output of NAND1, a second input coupled to the bypass path, and an output that functions as the output of the ith delay block 1302(i). For other blocks 1302(2)-1302(5), the third NAND gate NAND3 includes a first input coupled to the output of the ith delay chain 1304(i), a second input coupled to the bypass path, and an output that functions as the output of the ith delay block 1302(i).

As shown in FIG. 13, each delay block 1302 includes a bypass path, which bypasses a respective delay chain 1304. When a bypass path of a given delay block 1302 is enabled, the delay chain 1304 is disabled. Thus, the local input data signal is either propagated along the delay chain 1304 or along the bypass path. Each delay block 1302 receives a select signal SEL and its complement SELn that is used to control whether the bypass path or the delay chain 1304 is selected. The select signal SEL for a given delay block is provided to NAND1 The complement SELn for a given delay block is provided to NAND2. Each delay block 1302 receives a different select signal. The skew correction controller 1006 is configured to selectively enable or disable each of the bypass paths through output of a pair of complementary m-bit selection signals SEL<m:1>, SELn<m:1>. The number of bits m is equal to the number of delay blocks 1302. The skew correction controller 1006 is configured to output each ith pair of complementary bits SEL<i>, SELn<i> to a respective selection circuit of an ith block.

When the skew correction controller 1006 determines that an ith delay block 1302(i), and/or its ith delay chain 1304(i) is to be involved in the delay of the input signal IN, the skew correction controller 1006 may output the ith selection signal SEL<i> at a high or logic 1 level, and may output the ith complementary selection signal SELn<i> at a low or logic 0 level, which in turn disables the bypass path. In turn, the third NAND gate NAND3 generates the local output signal of the ith delay block 1302(i) in response to the output of the ith delay chain 1304(i). Alternatively, when the skew correction controller 1006 determines that an ith delay block 1302(i), and/or its ith delay chain 1304(i) is to be uninvolved or not participate in the delay of the input signal IN, the skew correction controller 1006 may output the ith selection signal SEL<i> at the low or logic 0 level and the ith complementary selection signal SELn<i> at the high or logic 1 level, which in turn enables the bypass path. In turn, the third NAND gate NAND3 generates the local output signal of the ith delay block 1302(i) in response to the signal communicated on the bypass path.

During a skew correction process, the skew correction controller 1006 may determine an amount of delay to set for a given selectable delay circuit (i.e., one of the selectable data delay circuits 1002 or the selectable clock circuit 1004). In turn, the skew correction controller 1006 may determine an m-bit pair of complementary selection signals SEL, SELn that causes a certain combination of the delay blocks 1302 to be involved or participate in the delay of the given input signal (e.g., one of the input signals DQ or the clock signal CLK) so that the given selectable delay circuit delays the given input signal by the determined amount of delay. When the skew correction controller 1006 determines to adjust the amount of delay, the skew correction controller 1006 determines how to change the m-bit pair of complementary selection signals SEL, SELn to effect the change in the amount of delay.

Figure 14:
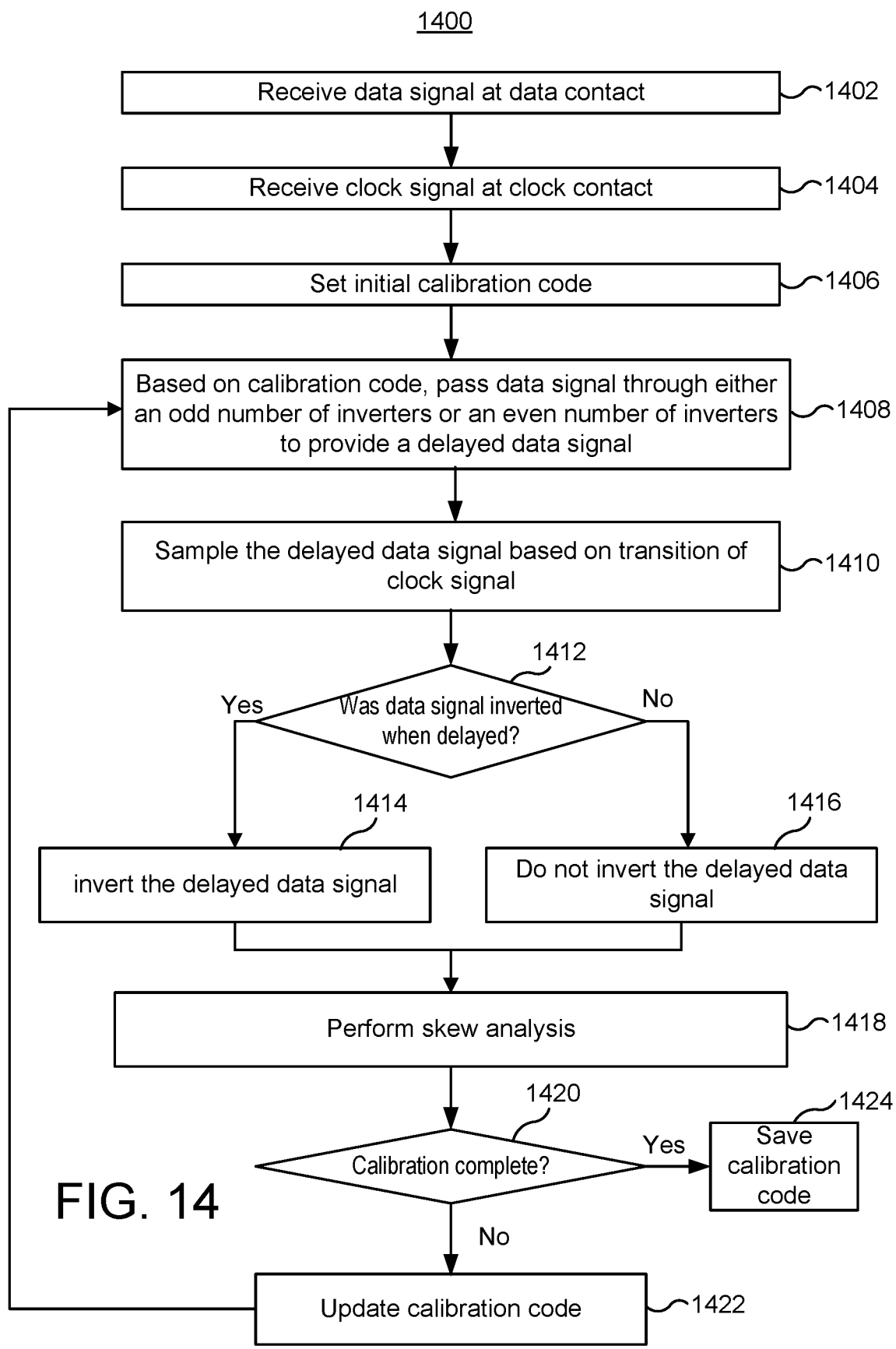
FIG. 14 is a flowchart of one embodiment of a process of calibrating a data signal to a clock signal.

FIG. 14 is a flowchart of one embodiment of a process 1400 of correcting skew between a clock signal CLK and a data signal DQ. In one embodiment, process 1400 is used during writing training, which in one embodiment, refers to training DQ signals received by a memory die 800. It may also be stated that process 1400 calibrates a data signal to a clock signal by computing a suitable delay for the data signal. In one embodiment, the process 1400 is performed by skew correction system 1000. Process 1400 describes correcting skew for one of the data signals DQ. The process 1400 is typically performed separately on each of the data signals DQ(1) to DQ(N). Thus, the delay for each data signal DQ(1) to DQ(N) may be separately calibrated to the clock signal CLK. For purpose of discussion, an example of processing data signal DQ(1) in FIG. 10 will be discussed. In one embodiment, process 1400 is performed by one or more control circuits on the memory die 800. In one embodiment, process 1400 is performed by one or more control circuits on the control die 908.

Step 1402 includes receiving a data signal DQ at a data contact. Step 1404 includes receiving a clock signal CLK on a clock contact. In one embodiment, the data contact and the clock contact are pins or pads 112, 114 on a memory die 800. In one embodiment, the data signal DQ and the clock signal CLK are received on the memory controller interface 915. In one embodiment, the data signal DQ and the clock signal CLK are provided by the memory controller 602. For example, the TM interface 296 may provide the data signal DQ and the clock signal CLK. In one embodiment, the data signal DQ and the clock signal CLK are compliant with the ONFI specification.

Step 1406 includes setting an initial calibration code. The calibration code refers to a digital code that is used to control the selectable data delay circuit 1002. In one embodiment, the calibration code is used for the selection signal. As noted above, the selection signal may be used to select the delay chains 1304. In one embodiment, the calibration code is the delay control signal DC_DQ (see FIG. 10). In one embodiment, the calibration code is modified during process 1400 to sweep the data signal across a (see FIG. 4) by causing different delays in the data signal.

Steps 1408-1422 pertain to scanning through various delays for the input data signal DQ(1). Prior to performing steps 1408-1422, the clock signal CLK may be delayed to cause all of the input data signals DQ(1) to DQ(N) to violate a hold failure. In general, the scanning through various delays may include first delaying DQ(1) until DQ(1) moves from the hold failure to a no hold failure. Then, the process scans through various delays for DQ(1) until DQ(1) moves from the no failure to a setup time failure. This scanning in effect scans over the data valid window $T_{DVW}$. Steps 1408-1422 may be performed separately for each input data signal DQ(1) to DQ(N).

Step 1408 includes passing the data signal through either an odd number of inverters or an event number of inverters to provide a delayed data signal. This is based on the calibration code. With reference to FIG. 13, if delay chain 1304(1) is selected, then the data signal will be passed through an odd number of inverters in the selectable data delay circuit 1002(1) in order to produce delayed data signal DQ_d. However, if delay chain 1304(1) is not selected, then the data signal will be passed through an even number of inverters in the selectable data delay circuit 1002 in order to produce delayed data signal DQ_d. In one embodiment, delay control circuit 1020(1) sends the calibration code to the selectable data delay circuit 1002(1) to control the delay by selecting the number of inverters in selectable data delay circuit 1002(1) through which the data signal DQ(1) is passed.

Step 1410 includes sampling the delayed data signal DQ(1)_d based on a transition of the clock signal CLK. With reference to FIG. 10, sampling circuit 1010(1) samples delayed data signal DQ(1)_d based on the delayed clock CLK_d. In some cases, sampling circuit 1010(1) samples delayed data signal DQ(1)_d based on a version of the clock CLK that is not delayed. Sampling circuit 1010(1) outputs a sampled data signal DQ(1)_s.

Step 1412 includes a determination of whether the data signal DQ(1) was inverted when the data signal was delayed. This determination may be made by data delay control circuit 1020(1), based on the calibration code that was sent to the selectable data delay circuit 1002(1). In one embodiment, if delay chain 1304(1) was selected, then the data signal was inverted. On the other hand, if delay chain 1304(1) was not selected then the data signal DQ(1) was not inverted.

If the data signal DQ(1) was inverted, then the sampled data signal DQ(1)_s is inverted in step 1414. In one embodiment, polarity correction circuit 1032(1) inverts the sampled data signal DQ(1)_s and outputs a polarity corrected data signal DQ(1)_pc. Thus, if the input data signal DQ(1) had a format such as in FIG. 2A, the sampled data signal DQ(1)_s will be inverted such as in FIG. 2B. However, after inverting the sampled data signal DQ(1)_s, the polarity corrected data signal DQ(1)_pc will have a format such as in FIG. 2A. With reference to FIG. 12, the second input 1208 of the MUX 1202 is selected in order to output the version of the sampled data signal DQ_s that was passed through the inverter 1204.

If the data signal DQ(1) was not inverted when delaying the data signal DQ(1), then the data signal DQ(1) is not inverted, in step 1416. In one embodiment, polarity correction circuit 1032(1) does not invert the sampled data signal DQ(1)_s. Herein, the output in this case is still referred to as a polarity corrected data signal DQ(1)_pc. With reference to FIG. 12, the first input 1210 of the MUX 1202 is selected in order to output the version of the sampled data signal DQ_s that was not passed through the inverter 1204.

After either step 1414 or 1416, skew analysis is performed in step 1418. The skew analysis is based on the polarity corrected data signal DQ(1)_pc (whether inverted or not). With reference to FIG. 10, the polarity corrected signal DQ(1)_pc is provided to the PISO 1034, along with other polarity corrected signals DQ_pc. The PISO 1034 serializes the polarity corrected signals DQ_pc to generate the serialized data signal DQ_sc. The comparator 1012 compares the serialized data signal DQ_sc to the reference signal REF. The output of the comparator 1012 is provided to the skew correction controller 1006, which may perform skew analysis. For example, the skew correction controller 1006 may look for the beginning and the end of the data valid window $T_{DVW}$, based on whether hold times and/or setup times are met/failed. The determination of whether hold times and/or setup times are met/failed may be based on the comparison signal CR<M:1> from the comparator 1012.

Step 1420 includes a determination of whether calibration is complete. Step 1420 may be performed by the skew correction controller 1006. As noted, during process 1400 the skew correction controller 1006 scans through a number of calibration codes to cause a variety of delays in the data signal DQ. In one embodiment, the skew correction controller 1006 looks for the beginning and the end of the data valid window $T_{DVW}$ (which are defined as t1 and t2 in FIG. 4) by scanning through various delays. If the skew correction controller 1006 determines that there are more delays to consider, then the calibration code is updated in step 1422. Then, the calibration code is used to cause the selectable data delay circuit 1002(1) to have a different delay, in step 1406. After the skew correction controller 1006 has determined that the calibration is complete (step 1420 is yes), the calibration code is saved in step 1424. Note that this calibration code is not necessarily the final calibration code used in process 1400.

Rather the calibration code that is saved in step 1424 may be based on calibration codes used in process 1400. In one embodiment, the calibration code is associated with time tce in the data valid window $T_{DVW}$. In one embodiment, time tce is determined is a mid-point between t1 and t1. The saved calibration code may be used when writing data to memory structure 926.

With reference again to FIG. 13, there are five delay blocks 1302 in the selectable data delay circuits 1002. Therefore, the delay control signal DC_DQ that is provided to the selectable data delay circuit 1002 may have up to five bits. However, in some embodiments, the delay control signal DC_DQ has only four bits. This means that four of the delay blocks 1302 will each be controlled by one bit of the delay control signal DC_DQ. However, one of the delay blocks 1302 will not be controlled by the delay control signal DC_DQ. Instead, that delay block 1302 may receive a control signal that effectively removes the delay chain in that delay block 1302 from the chain of delay block 1302. For example, the bypass path can always be selected for that delay block 1302.

In some embodiments, the skew correction controller 1006 is configured to operate the selectable data delay circuit 1002 at different resolutions, at different times. The resolution refers to the smallest difference in the amount of delay that is possible. One technique for operating the selectable data delay circuit 1002 at different resolutions is to select which set of the delay blocks 1302 are used. For example, a four bit delay control signal DC_DQ can be used, with the resolution depending on whether delay block 1302(1) is provided the least significant bit of the delay control signal DC_DQ.

For example, with reference to FIG. 13, a high resolution delay can be achieved by providing the least significant bit of a four bit delay control signal DC_DQ to delay block 1302(1), the next bit to delay block 1302(2), the next bit to delay block 1302(3), and the most significant bit to delay block 1302(4). Delay block 1302(5) may be effectively removed by always selecting the bypass path in block 1302(5). With reference to FIG. 13, a low resolution delay can be achieved by providing the least significant bit of a four bit delay control signal DC_DQ to delay block 1302(2), the next bit to delay block 1302(3), the next bit to delay block 1302(4), and the most significant bit to delay block 1302(5). Delay block 1302(1) may be effectively removed by always selecting the bypass path in block 1302(1).

The high resolution delay is given by the delay of delay chain 1304(1). In this example, the high resolution delay is one unit of delay, as given by the single delay cell in delay chain 1304(2). The low resolution delay is given by the delay of delay chain 1304(2). In this example, the low resolution delay is two units of delay, as given by the two delay cells in delay chain 1304(2). In these example, the resolution is based on which delay block 1302 is provided with the least significant bit of the delay control signal DC_DQ.

In some embodiments, the skew correction controller 1006 is configured to operate the selectable data delay circuits 1002 at multiple delay ranges. The delay range refers to the difference in delay between the smallest possible delay and the largest possible delay. The smallest possible delay is defined herein as not selecting any of the delay chains 1304. With reference to FIG. 13, a low delay range can be achieved by providing the least significant bit of a four bit delay control signal DC_DQ to delay block 1302(1), the next bit to delay block 1302(2), the next bit to delay block 1302(3), and the most significant bit to delay block 1302(4). Delay block 1302(5) may be effectively removed by always selecting the bypass path in block 1302(5). With reference to FIG. 13, a high delay range can be achieved by providing the least significant bit of a four bit delay control signal DC_DQ to delay block 1302(2), the next bit to delay block 1302(3), the next bit to delay block 1302(4), and the most significant bit to delay block 1302(5). The delay chain 1304(1) in delay block 1302(1) may be removed by always selecting the bypass path in block 1302(1). In these example, the delay range is based on which delay block 1302 is provided with the most significant bit of the delay control signal DC_DQ.

Note the having a high delay resolution helps to improve the accuracy of correcting the skew between the clock signal and the data signal. On the other hand, a high delay range can be beneficial in being able to cover a larger data valid window $T_{DVW}$.

Figure 15:
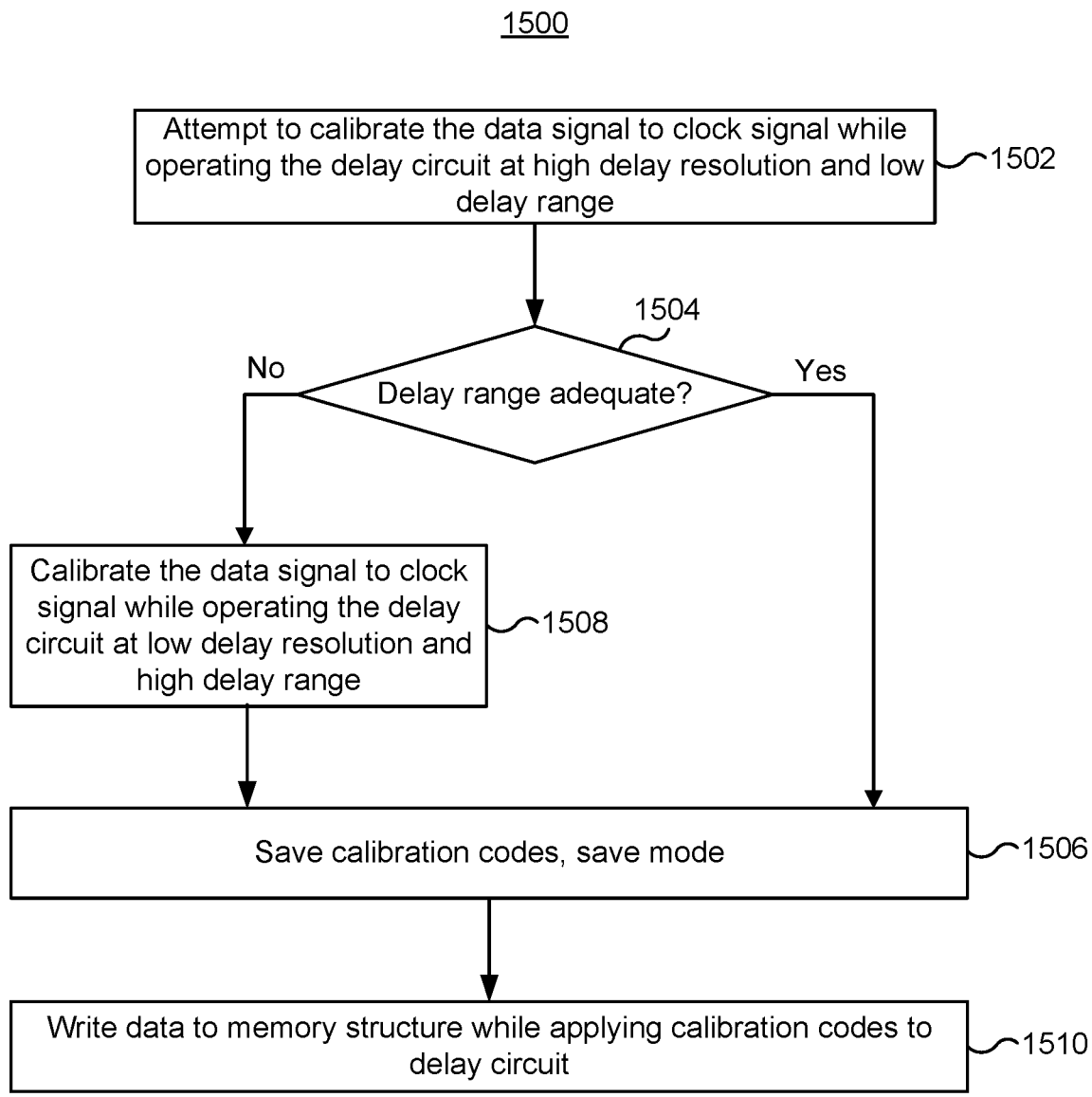
FIG. 15 is a flowchart of one embodiment of a process of operating an adjustable data delay circuits in different modes.

FIG. 15 is a flowchart of one embodiment of a process 1500 of operating a selectable data delay circuits 1002 in different modes. A first mode has a high resolution and a low delay range. A second mode has a low resolution, but a high delay range. Thus, process 1500 can be used to provide high delay resolution to improve the accuracy of correcting the skew between the clock signal and the data signal, or alternatively, to provide a high delay range to cover a larger data valid window $T_{DVW}$. Process 1500 is used during an embodiment of a skew correction process. In process 1500 all of the selectable data delay circuits 1002(1) to 1002(N) are operated in the same mode at a given point in time. In one embodiment, process 1500 is performed by one or more control circuits on the memory die 800. In one embodiment, process 1500 is performed by one or more control circuits on the control die 908.

In process 1500, the skew correction controller 1006 first operates the selectable data delay circuits 1002(1) to 1002(N) in a mode having a high resolution and a low delay range. For example, each of the delay control signals DC_DQ(1) to DC_DQ(N) is a four bit signal. The least significant bit of the four bit delay control signal DC_DQ is provided to delay block 1302(1), the next bit to delay block 1302(2), the next bit to delay block 1302(3), and the most significant bit to delay block 1302(4). The delay chain 1304(5) in delay block 1302(5) is effectively removed by always selecting the bypass path in delay block 1302(5).

Step 1502 includes attempting to calibrate the data signals DQ(1) to DQ(N) to the clock signal CLK while operating the selectable data delay circuits 1002(1) to 1002(N) in the first mode. This calibration process might or might not succeed. One reason why this calibration could fail is if the delay range is not large enough to cover the data valid window $T_{DVW}$. During an embodiment of the calibration process, the skew correction controller 1006 applies different amount of delays to the data signals DQ(1) to DQ(N) to effectively sweep the data signals DQ(1) to DQ(N) across a data valid window $T_{DVW}$. If the delay range is not large enough, then the skew correction controller 1006 will not be able to sweep the data signals DQ(1) to DQ(N) across the entire data valid window $T_{DVW}$. Hence, the calibration process will fail in an algorithm that looks for the beginning and the end of the data valid window $T_{DVW}$. For example, the algorithm might be unable to locate a hold time violation and/or a setup time violation. Step 1504 includes a determination, by the skew correction controller 1006, whether the calibration process was successful. If the calibration process was successful, then the calibration codes from the successful calibration process is stored, in step 1506. Note that a separate calibration code is stored for each selectable data delay circuits 1002(1) to 1002(N). The mode is also saved in step 1506. If the calibration process was not successful, then the process continues at step 1508.

Step 1508 includes calibrating the data signals DQ(1) to DQ(N) to the clock signal CLK while operating the selectable data delay circuits 1002(1) to 1002(N) in the second mode. The second mode has a low delay resolution, but a wide (or high) delay range. For example, the least significant bit of a four bit delay control signal DC_DQ is provided to delay block 1302(2), the next bit to delay block 1302(3), the next bit to delay block 1302(4), and the most significant bit to delay block 1302(5). The delay chain 1304(1) in delay block 1302(1) is effectively removed by always selecting the bypass path in delay block 1302(1). It will be assumed that the calibration process is successful due to the increase in the delay range. In other words, it will be assumed that with the larger delay range, the entire data valid window $T_{DVW}$ may be scanned. Thus, the calibration codes from the successful calibration process is stored, in step 1506. Again, a separate calibration code is stored for each selectable data delay circuits 1002(1) to 1002(N). The mode is also saved in step 1506.

Step 1510 includes writing data to non-volatile memory cells in memory structure 926 while applying the stored calibration codes to the respective selectable data delay circuits 1002(1) to 1002(N). Moreover, the mode that was successful at calibrating is used again. Thus, if step 1502 was successful at calibration, then the high resolution, but low delay range mode is used. However, if step 1508 was successful at calibration, then the low resolution, but high delay range mode is used.

In view of the foregoing, it can be seen that a first embodiment includes, an apparatus comprising an interface configured to receive a data signal and a clock signal, and one or more control circuits in communication with the interface. The one or more control circuits are configured to delay the data signal by a selectable delay to produce a delayed data signal. Delaying the data signal inverts the data signal for a first set of the selectable delays and does not invert the data signal for a second set of the selectable delays. The one or more control circuits are configured sample the delayed data signal in response to a transition of a clock signal and produce a sampled data signal. The one or more control circuits are configured to scan through different values of the selectable delay in order to calibrate the data signal to the clock signal. The one or more control circuits are configured to invert the sampled data signal if the data signal was inverted when delaying the data signal prior to sampling the delayed data signal.

In a second embodiment and in furtherance to the first embodiment, the one or more control circuits are configured to pass the data signal through a single inverter and zero or more even number of inverters to achieve any of the first set of the selectable delays. The one or more control circuits are configured to bypass the single inverter and pass the data signal through the zero or more even number of inverters to achieve any of the second set of the selectable delays.

In a third embodiment and in furtherance to the first or second embodiments, the one or more control circuits comprise a first delay chain comprising a single inverter to delay the data signal by a first amount of time and to invert the data signal. The first delay chain is selected for the first set of the selectable delays and is not selected for the second set of the selectable delays. The one or more control circuits comprise a plurality of additional delay chains configured to delay the data signal by greater amounts of time than the first amount of time and to not invert the data signal.

In a fourth embodiment and in furtherance to any of the first to third embodiments, the interface configured to receive the data signal and the clock signal comprises a first input contact configured to receive the data signal, and a second input contact configured to receive the clock signal.

In a fifth embodiment and in furtherance to the fourth embodiment, the one or more control circuits comprise a latch configured to receive the data signal from the first input contact and to receive the clock signal from the second input contact. The latch is configured to latch the data signal in response to the transition of the clock signal.

In a sixth embodiment and in furtherance to any of the first to fifth embodiments, the one or more control circuits comprise a multiplexer having a first input and a second input, wherein the first input receives the sampled data signal, and an inverter having an input that receives the sampled data signal. The inverter also has an output connected to the second input of the multiplexer. The one or more control circuits are configured to provide a select signal to the multiplexer to select the first input of the multiplexer if the data signal was delayed by any of the first set of the selectable delays. The one or more control circuits are configured to select the second input of the multiplexer if the data signal was delayed by any of the second set of the selectable delays.

In a seventh embodiment and in furtherance to any of the first to sixth embodiments, the one or more control circuits are further configured to delay the data signal using a first resolution in an amount of the selectable delay and a first range in the selectable delay, determine whether the first range in the selectable delay is adequate to scan a data valid window, and delay the data signal using a second resolution in an amount of the selectable delay that is less than the first resolution and a second range in the selectable delay that is greater than the first range in the selectable delay if the first range is inadequate to scan the data valid window.

In an eighth embodiment and in furtherance to any of the first to seventh embodiments, the one or more control circuits are further configured to store a calibration code based on calibrating the sampled data signal to the clock signal, use the calibration code to delay another data signal to produce another delayed data signal, sample the other delayed data signal in response to a transition of another clock signal to produce another sampled data signal based on the sample, and invert the other sampled data signal if the other data signal was inverted when delaying the other data signal.

In a ninth embodiment and in furtherance to any of the first to eighth embodiments, the apparatus further comprises a memory structure having non-volatile memory cells. The one or more control circuits are further configured to store data in the non-volatile memory cells based on the other data signal.

One embodiment includes a method comprising receiving a data signal at a first input contact of a memory system, receiving a clock signal at a second input contact of the memory system, delaying the data signal by different delay times to produce a delayed data signal, including passing the data signal through an odd number of inverters for a first set of the different delay times and passing the data signal through an even number of inverters for a second set of the different delay times. The method includes sampling the delayed data signal in response to a transition of the clock signal to produce a sampled data signal, inverting the sampled data signal if the data signal was delayed by any of the first set of the different delay times to produce a comparison data signal, using the sampled data signal for the comparison data signal if the data signal was delayed by any of the second set of the different delay times, and correcting skew between the data signal and the clock signal based on an analysis of the comparison data signal that corresponds to delaying the data signal by the first set and the second set of the different delay times.

One embodiment includes a non-volatile memory system, comprising a data input contact, a clock input contact, and a delay circuit comprising a plurality of delay blocks each having one or more inverters. The delay circuit is configured to pass a data signal from the data input contact through either an odd number of the inverters or an even number of the inverters to produce a delayed data signal. The non-volatile memory system has a sampling circuit configured to sample the delayed data signal from the delay circuit based on a clock signal from the clock input contact. The non-volatile memory system has a skew correction circuit configured to control the number of the inverters in the delay circuit through which the data signal is passed in order to correct skew between the clock signal and the data signal. The skew correction circuit is further configured to store a calibration code based on correcting the skew. The non-volatile memory system has a polarity correction circuit configured to invert the data signal from the sampling circuit if that the delay circuit passed the data signal through the odd number of the inverters.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus comprising:
   an interface configured to receive a data signal and a clock signal;
   one or more control circuits in communication with the interface, wherein the one or more control circuits are configured to:
      delay the data signal by a selectable delay to produce a delayed data signal, wherein delaying the data signal inverts the data signal for a first set of the selectable delays and does not invert the data signal for a second set of the selectable delays;
      sample the delayed data signal in response to a transition of the clock signal and produce a sampled data signal;
      scan through different values of the selectable delay in order to calibrate the data signal to the clock signal; and
      invert the sampled data signal if the data signal was inverted when delaying the data signal prior to sampling the delayed data signal.

2. The apparatus of claim 1, wherein the one or more control circuits are configured to:
   pass the data signal through a single inverter and zero or more even number of inverters to achieve any of the first set of the selectable delays; and
   bypass the single inverter and pass the data signal through the zero or more even number of inverters to achieve any of the second set of the selectable delays.

3. The apparatus of claim 1, wherein the one or more control circuits comprise:
   a first delay chain comprising a single inverter to delay the data signal by a first amount of time and to invert the data signal, wherein the first delay chain is selected for the first set of the selectable delays and is not selected for the second set of the selectable delays; and
   a plurality of additional delay chains configured to delay the data signal by greater amounts of time than the first amount of time and to not invert the data signal.

4. The apparatus of claim 1, wherein the interface configured to receive the data signal and the clock signal comprises:
   a first input contact configured to receive the data signal; and
   a second input contact configured to receive the clock signal.

5. The apparatus of claim 4, wherein the one or more control circuits comprise a latch configured to receive the data signal from the first input contact and to receive the clock signal from the second input contact, wherein the latch is configured to latch the data signal in response to the transition of the clock signal.

6. The apparatus of claim 1, wherein the one or more control circuits comprise:
   a multiplexer having a first input and a second input, wherein the first input receives the sampled data signal; and
   an inverter having an input that receives the sampled data signal, the inverter having an output connected to the second input of the multiplexer;
   wherein the one or more control circuits are configured to provide a select signal to the multiplexer to select the first input of the multiplexer if the data signal was delayed by any of the first set of the selectable delays, the one or more control circuits are configured to select the second input of the multiplexer if the data signal was delayed by any of the second set of the selectable delays.

7. The apparatus of claim 1, wherein the one or more control circuits are further configured to:
   delay the data signal using a first resolution in an amount of the selectable delay and a first range in the selectable delay;
   determine whether the first range in the selectable delay is adequate to scan a data valid window; and
   delay the data signal using a second resolution in an amount of the selectable delay that is less than the first resolution and a second range in the selectable delay that is greater than the first range in the selectable delay if the first range is inadequate to scan the data valid window.

8. The apparatus of claim 1, wherein the one or more control circuits are further configured to:
   store a calibration code based on calibrating the sampled data signal to the clock signal;
   use the calibration code to delay another data signal to produce another delayed data signal;
   sample the other delayed data signal in response to a transition of another clock signal to produce another sampled data signal based on the sample; and
   invert the other sampled data signal if the other data signal was inverted when delaying the other data signal.

9. The apparatus of claim 8, further comprising:
   a memory structure having non-volatile memory cells, wherein the one or more control circuits are further configured to store data in the non-volatile memory cells based on the other data signal.

10. A method comprising:
    receiving a data signal at a first input contact of a memory system;
    receiving a clock signal at a second input contact of the memory system;
    delaying the data signal by different delay times to produce a delayed data signal, including passing the data signal through an odd number of inverters for a first set of the different delay times and passing the data signal through an even number of inverters for a second set of the different delay times;
    sampling the delayed data signal in response to a transition of the clock signal to produce a sampled data signal;
    inverting the sampled data signal in response to the data signal being delayed by any of the first set of the different delay times to produce a comparison data signal;

using the sampled data signal for the comparison data signal in response to the data signal being delayed by any of the second set of the different delay times; and correcting skew between the data signal and the clock signal based on an analysis of the comparison data signal that corresponds to delaying the data signal by the first set and the second set of the different delay times.

11. The method of claim 10, wherein passing the data signal through the odd number of inverters for the first set of the different delay times comprises:

passing the data signal through a delay chain having a single inverter.

12. The method of claim 11, wherein passing the data signal through the even number of inverters for the second set of the different delay times comprises:

bypassing the delay chain having the single inverter; and
passing the data signal through one or more delay chains having each having an even number of inverters.

13. The method of claim 10, further comprising:

storing a calibration code based on correcting the skew between the data signal and the clock signal;
receiving another data signal at the first input contact while receiving another clock signal at the second input contact;
delaying the other data signal by a delay time that is based on the calibration code, including passing the other data signal through a delay chain having a single inverter;
sampling the other delayed data signal in response to a transition of the other clock signal to produce another sampled data signal;
inverting the other sampled data signal; and
writing data to non-volatile memory cells based on the other sampled data signal.

14. A non-volatile memory system, comprising:

a data input contact;
a clock input contact;
a delay circuit comprising a plurality of delay blocks each having one or more inverters, wherein the delay circuit is configured to pass a data signal from the data input contact through either an odd number of the inverters or an even number of the inverters to produce a delayed data signal;
a sampling circuit configured to sample the delayed data signal from the delay circuit based on a clock signal from the clock input contact;
a skew correction circuit configured to control the number of the inverters in the delay circuit through which the data signal is passed in order to correct skew between the clock signal and the data signal, wherein the skew correction circuit is further configured to store a calibration code based on correcting the skew; and
a polarity correction circuit configured to invert the data signal from the sampling circuit if that the delay circuit passed the data signal through the odd number of the inverters.

15. The non-volatile memory system of claim 14, wherein each delay block has an input and an output, wherein the delay blocks are chained together with an output of one delay block connected to an input of another delay block, wherein the input of an initial block of the delay blocks receives the data signal from the data input contact, wherein the output of a final block of the delay blocks provides the delayed data signal.

16. The non-volatile memory system of claim 15, wherein at least one of the delay blocks comprises a first path having a single inverter to delay the data signal by a first amount of time and a second path that bypasses the single inverter.

17. The non-volatile memory system of claim 16, wherein each remaining delay blocks have a first path having an even number of inverters to delay the data signal a selectable amount of time and a second path that bypasses the even number of inverters.

18. The non-volatile memory system of claim 14, wherein:

the sampling circuit comprises a latch configured to receive the data signal from the data input contact and to receive the clock signal from the clock input contact, wherein the latch is configured to latch the data signal in response to a transition of the clock signal and output a latched data signal; and
the correction circuit comprises a multiplexer having a first input and a second input, wherein the first input receives the latched data signal, wherein the correction circuit further comprises an inverter having an input that receives the latched data signal, the inverter having an output connected to the second input of the multiplexer.

19. The non-volatile memory system of claim 14, further comprising:

a memory structure comprising non-volatile memory cells; and
one or more control circuits in communication with the memory structure, wherein the one or more control circuits are configured to write data to the non-volatile memory cells based on a program data signal received on the data input contact while the skew correction circuit applies the calibration code to the delay circuit.

20. The non-volatile memory system of claim 14, wherein the skew correction circuit is further configured to:

control the delay circuit to have a first resolution in an amount of delay and a first range in delay;
determine whether the first range is adequate with the first resolution to scan a data valid window; and
control the delay circuit to have a second resolution that is lower than the first resolution and a second range that is greater than the first range if the first range is inadequate to scan the data valid window.

* * * * *